(12) United States Patent  
Silverbrook

(10) Patent No.: US 7,841,086 B2
(45) Date of Patent: *Nov. 30, 2010

(54) METHOD OF FABRICATING INKJET PRINTHEAD WITH PROJECTIONS PATTERNED ACROSS NOZZLE PLATE

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 18 days.

This patent is subject to a terminal disclaimer.

(21) Appl. No.: 12/268,911

(22) Filed: Nov. 11, 2008

(65) Prior Publication Data

US 2009/0065475 A1   Mar. 12, 2009

Related U.S. Application Data

(63) Continuation of application No. 11/246,682, filed on Oct. 11, 2005, now Pat. No. 7,464,465.

(51) Int. Cl.
*B21D 53/00* (2006.01)

(52) U.S. Cl. .......................... 29/890.1; 29/832; 29/846; 29/849; 216/27; 347/47

(58) Field of Classification Search .................. 29/890.1
See application file for complete search history.

(56) References Cited

U.S. PATENT DOCUMENTS

| 5,665,249 | A  |   | 9/1997  | Burke et al. |
| 6,093,656 | A  | * | 7/2000  | Lin ............................. 438/734 |
| 6,254,220 | B1 |   | 7/2001  | Silverbrook |
| 6,464,340 | B2 |   | 10/2002 | Silverbrook |
| 6,482,574 | B1 |   | 11/2002 | Ramaswami et al. |
| 6,565,760 | B2 |   | 5/2003  | Hardisty et al. |
| 6,672,710 | B1 |   | 1/2004  | Silverbrook et al. |
| 7,464,465 | B2 | * | 12/2008 | Silverbrook ............... 29/890.1 |
| 2003/0146464 | A1 | | 8/2003 | Prophet |
| 2004/0100532 | A1 | | 5/2004 | Silverbrook |
| 2005/0093397 | A1 | | 5/2005 | Yamada et al. |

* cited by examiner

*Primary Examiner*—Derris H Banks
*Assistant Examiner*—Azm Parvez

(57) ABSTRACT

A method of fabricating an inkjet printhead. The method includes the steps of: (a) forming a plurality of MEMS ink ejection assemblies on an ink-ejection surface of a silicon substrate, each ink ejection assembly being sealed with roof material spanning across the ink ejection assemblies to define a nozzle plate; (b) etching partially into the roof material to form simultaneously a respective nozzle rim for each ink ejection assembly and a plurality of projections patterned across the nozzle plate between nozzle rims; and (c) etching through the roof material to form a respective nozzle aperture for each ink ejection assembly. The projections patterned across the nozzle plate between nozzle rims are useful for reducing stiction between particulates and the nozzle plate.

19 Claims, 37 Drawing Sheets

METHOD OF FABRICATING INKJET PRINTHEAD WITH PROJECTIONS PATTERNED ACROSS NOZZLE PLATE

CROSS REFERENCE TO RELATED APPLICATION

This application is a continuation of Ser. No. 11/246,682 filed on Oct. 11, 2005 all of which is herein incorporated by reference.

FIELD OF THE INVENTION

The present invention relates to the field of inkjet printers and discloses an inkjet printing system using printheads manufactured with micro-electromechanical systems (MEMS) techniques.

CO-PENDING APPLICATIONS

The following applications have been filed by the Applicant simultaneously with application Ser. No. 11/246,682:

| | | | | |
|---|---|---|---|---|
| 11/246,676 | 11/246,677 | 11/246,678 | 11/246,679 | 7,438,381 |
| 7,441,863 | 7,438,382 | 7,425,051 | 7,399,057 | 11/246,611 |
| 11/246,670 | 11/246,669 | 11/246,704 | 11/246,710 | 7,445,310 |
| 7,399,054 | 7,425,049 | 7,367,648 | 7,370,936 | 7,401,886 |
| 11/246,708 | 7,401,887 | 7,384,119 | 7,401,888 | 7,387,358 |
| 7,413,281 | 11/246,687 | 11/246,718 | 7,322,681 | 11/246,686 |
| 11/246,703 | 11/246,691 | 11/246,711 | 11/246,690 | 11/246,712 |
| 11/246,717 | 7,401,890 | 7,401,910 | 11/246,701 | 11/246,702 |
| 7,431,432 | 11/246,697 | 7,445,317 | 11/246,699 | 11/246,675 |
| 11/246,674 | 11/246,667 | 7,303,930 | 11/246,672 | 7,401,405 |
| 11/246,683 | | | | |

The disclosures of these co-pending applications are incorporated herein by reference.

CROSS REFERENCES TO RELATED APPLICATIONS

Various methods, systems and apparatus relating to the present invention are disclosed in the following U.S. patents/patent applications filed by the applicant or assignee of the present invention:

| | | | | |
|---|---|---|---|---|
| 6,750,901 | 6,476,863 | 6,788,336 | 7,249,108 | 6,566,858 |
| 6,331,946 | 6,246,970 | 6,442,525 | 7,346,586 | 09/505,951 |
| 6,374,354 | 7,246,098 | 6,816,968 | 6,757,832 | 6,334,190 |
| 6,745,331 | 7,249,109 | 7,197,642 | 7,093,139 | 10/636,263 |
| 10/636,283 | 10/866,608 | 7,210,038 | 7,401,223 | 10/940,653 |
| 10/942,858 | 7,364,256 | 7,258,417 | 7,293,853 | 7,328,968 |
| 7,270,395 | 11/003,404 | 11/003,419 | 7,334,864 | 7,255,419 |
| 7,284,819 | 7,229,148 | 7,258,416 | 7,273,263 | 7,270,393 |
| 6,984,017 | 7,347,526 | 7,357,477 | 11/003,463 | 7,364,255 |
| 7,357,476 | 11/003,614 | 7,284,820 | 7,341,328 | 7,246,875 |
| 7,322,669 | 6,623,101 | 6,406,129 | 6,505,916 | 6,457,809 |
| 6,550,895 | 6,457,812 | 7,152,962 | 6,428,133 | 7,204,941 |
| 7,282,164 | 10/815,628 | 7,278,727 | 7,417,141 | 10/913,374 |
| 7,367,665 | 7,138,391 | 7,153,956 | 7,423,145 | 10/913,379 |
| 10/913,376 | 7,122,076 | 7,148,345 | 11/172,816 | 11/172,815 |
| 11/172,814 | 7,416,280 | 7,252,366 | 10/683,064 | 7,360,865 |
| 6,746,105 | 7,156,508 | 7,159,972 | 7,083,271 | 7,165,834 |
| 7,080,894 | 7,201,469 | 7,090,336 | 7,156,489 | 7,413,283 |
| 7,438,385 | 7,083,257 | 7,258,422 | 7,255,423 | 7,219,980 |
| 10/760,253 | 7,416,274 | 7,367,649 | 7,118,192 | 10/760,194 |
| 7,322,672 | 7,077,505 | 7,198,354 | 7,077,504 | 10/760,189 |
| 7,198,355 | 7,401,894 | 7,322,676 | 7,152,959 | 7,213,906 |
| 7,178,901 | 7,222,938 | 7,108,353 | 7,104,629 | 7,246,886 |
| 7,128,400 | 7,108,355 | 6,991,322 | 7,287,836 | 7,118,197 |
| 10/728,784 | 7,364,269 | 7,077,493 | 6,962,402 | 10/728,803 |
| 7,147,308 | 10/728,779 | 7,118,198 | 7,168,790 | 7,172,270 |
| 7,229,155 | 6,830,318 | 7,195,342 | 7,175,261 | 10/773,183 |
| 7,108,356 | 7,118,202 | 10/773,186 | 7,134,744 | 10/773,185 |
| 7,134,743 | 7,182,439 | 7,210,768 | 10/773,187 | 7,134,745 |
| 7,156,484 | 7,118,201 | 7,111,926 | 7,431,433 | 7,018,021 |
| 7,401,901 | 11/060,805 | 11/188,017 | 11/097,308 | 11/097,309 |
| 7,246,876 | 7,431,431 | 7,419,249 | 7,377,623 | 7,328,978 |
| 7,334,876 | 7,147,306 | 09/575,197 | 7,079,712 | 6,825,945 |
| 7,330,974 | 6,813,039 | 6,987,506 | 7,038,797 | 6,980,318 |
| 6,816,274 | 7,102,772 | 7,350,236 | 6,681,045 | 6,728,000 |
| 7,173,722 | 7,088,459 | 09/575,181 | 7,068,382 | 7,062,651 |
| 6,789,194 | 6,789,191 | 6,644,642 | 6,502,614 | 6,622,999 |
| 6,669,385 | 6,549,935 | 6,987,573 | 6,727,996 | 6,591,884 |
| 6,439,706 | 6,760,119 | 7,295,332 | 6,290,349 | 6,428,155 |
| 6,785,016 | 6,870,966 | 6,822,639 | 6,737,591 | 7,055,739 |
| 7,233,320 | 6,830,196 | 6,832,717 | 6,957,768 | 09/575,172 |
| 7,170,499 | 7,106,888 | 7,123,239 | 10/727,181 | 10/727,162 |
| 7,377,608 | 7,399,043 | 7,121,639 | 7,165,824 | 7,152,942 |
| 10/727,157 | 7,181,572 | 7,096,137 | 7,302,592 | 7,278,034 |
| 7,188,282 | 10/727,159 | 10/727,180 | 10/727,179 | 10/727,192 |
| 10/727,274 | 10/727,164 | 10/727,161 | 10/727,198 | 10/727,158 |
| 10/754,536 | 10/754,938 | 10/727,160 | 10/934,720 | 7,171,323 |
| 7,369,270 | 6,795,215 | 7,070,098 | 7,154,638 | 6,805,419 |
| 6,859,289 | 6,977,751 | 6,398,332 | 6,394,573 | 6,622,923 |
| 6,747,760 | 6,921,144 | 10/884,881 | 7,092,112 | 7,192,106 |
| 11/039,866 | 7,173,739 | 6,986,560 | 7,008,033 | 11/148,237 |
| 7,195,328 | 7,182,422 | 7,374,266 | 7,427,117 | 10/854,488 |
| 7,281,330 | 10/854,503 | 7,328,956 | 10/854,509 | 7,188,928 |
| 7,093,989 | 7,377,609 | 10/854,495 | 10/854,498 | 10/854,511 |
| 7,390,071 | 10/854,525 | 10/854,526 | 10/854,516 | 7,252,353 |
| 10/854,515 | 7,267,417 | 10/854,505 | 10/854,493 | 7,275,805 |
| 7,314,261 | 10/854,490 | 7,281,777 | 7,290,852 | 10/854,528 |
| 10/854,523 | 10/854,527 | 10/854,524 | 10/854,520 | 10/854,514 |
| 10/854,519 | 10/854,513 | 10/854,499 | 10/854,501 | 7,266,661 |
| 7,243,193 | 10/854,518 | 10/854,517 | 10/934,628 | 7,163,345 |
| 10/760,254 | 7,425,050 | 7,364,263 | 7,201,468 | 7,360,868 |
| 10/760,249 | 7,234,802 | 7,303,255 | 7,287,846 | 7,156,511 |
| 10/760,264 | 7,258,432 | 7,097,291 | 10/760,222 | 10/760,248 |
| 7,083,273 | 7,367,647 | 7,374,355 | 7,441,880 | 10/760,205 |
| 10/760,206 | 10/760,267 | 10/760,270 | 7,198,352 | 7,364,264 |
| 7,303,251 | 7,201,470 | 7,121,655 | 7,293,861 | 7,232,208 |
| 7,328,985 | 7,344,232 | 7,083,272 | 11/014,764 | 11/014,763 |
| 7,331,663 | 7,360,861 | 7,328,973 | 7,427,121 | 7,407,262 |
| 7,303,252 | 7,249,822 | 11/014,762 | 7,311,382 | 7,360,860 |
| 7,364,257 | 7,390,075 | 7,350,896 | 7,429,096 | 7,384,135 |
| 7,331,660 | 7,416,287 | 11/014,737 | 7,322,684 | 7,322,685 |
| 7,311,381 | 7,270,405 | 7,303,268 | 11/014,735 | 7,399,072 |
| 7,393,076 | 11/014,750 | 11/014,749 | 7,249,833 | 11/014,769 |
| 11/014,729 | 7,331,661 | 11/014,733 | 7,300,140 | 7,357,492 |
| 7,357,493 | 11/014,766 | 7,380,902 | 7,284,816 | 7,284,845 |
| 7,255,430 | 7,390,080 | 7,328,984 | 7,350,913 | 7,322,671 |
| 7,380,910 | 7,431,424 | 11/014,716 | 11/014,732 | 7,347,534 |
| 7,441,865 | 11/097,185 | 7,367,650 | | |

The disclosures of these applications and patents are incorporated herein by reference.

BACKGROUND OF THE INVENTION

The present invention involves the ejection of ink drops by way of forming gas or vapor bubbles in a bubble forming liquid. This principle is generally described in U.S. Pat. No. 3,747,120 (Stemme). Each pixel in the printed image is derived ink drops ejected from one or more ink nozzles. In recent years, inkjet printing has become increasing popular primarily due to its inexpensive and versatile nature. Many different aspects and techniques for inkjet printing are described in detail in the above cross referenced documents.

Clogging is one of the principle causes of nozzle failure. Nozzles can clog from dried ink and contaminants in the ink. However, paper dust attaching to the exterior of the nozzle plate is another cause of clogging. The airborne paper dust adheres to the nozzle plate by 'stiction' as it is known. Capping and maintenance cycles help to clean paper dust away, but often the stiction between the dust particle and the nozzle plate and the too strong.

SUMMARY OF THE INVENTION

Accordingly, the present invention provides a method of forming a low-stiction nozzle plate for an inkjet printhead, said nozzle plate having a plurality of nozzle apertures defined therein, each nozzle aperture having a respective nozzle rim, said method comprising the steps of:

(a) providing a partially-fabricated printhead comprising a plurality of inkjet nozzle assemblies sealed with roof material;

(b) etching partially into said roof material to define simultaneously said nozzle rims and a plurality of stiction-reducing formations; and (c) etching through said roof material to define said nozzle apertures, thereby forming said nozzle plate.

Preferably the formations are columnar projections of equal length extending normal to the plane of the nozzle plate.

In a first aspect the present invention provides a method of fabricating a suspended beam in a MEMS process, said method comprising the steps of:

(a) etching a pit in a substrate, said pit having a base and sidewalls;

(b) depositing sacrificial material on a surface of said substrate so as to fill said pit;

(c) removing said sacrificial material from a perimeter region within said pit and from said substrate surface surrounding said pit;

(d) reflowing remaining sacrificial material within said pit such that said remaining sacrificial material contacts said sidewalls;

(e) depositing beam material on said substrate surface and on said reflowed sacrificial material; and (f) removing said reflowed sacrificial material to form said suspended beam.

Optionally, said suspended beam is substantially planar.

Optionally, all parts of said suspended beam have substantially the same thickness.

Optionally, said suspended beam is an actuator for an inkjet nozzle.

Optionally, said actuator is a heater element.

Optionally, said heater element is suspended between a pair of electrodes.

Optionally, said substrate is a silicon wafer.

Optionally, said silicon wafer comprises at least one surface oxide layer.

Optionally, said sacrificial material is photoresist.

Optionally, said photoresist is removed by exposure through a mask followed by development.

Optionally, said perimeter region comprises an area adjacent at least two of said sidewalls.

Optionally, said perimeter region comprises an area adjacent all of said sidewalls.

Optionally, removal of said sacrificial material from said perimeter region results in a space of less than 1 micron between said remaining sacrificial material and at least two of said sidewalls.

Optionally, removal of said sacrificial material from said perimeter region results in a space of less than 1 micron between said remaining sacrificial material and all of said sidewalls.

Optionally, said reflowing is performed by heating said sacrificial material.

Optionally, said sacrificial material is treated to prevent further reflow prior to deposition of beam material.

Optionally, said treatment comprises UV curing.

Optionally, said beam material is etched into a predetermined configuration after deposition.

Optionally, further MEMS process steps are performed after deposition of said beam material and prior to said removal of said reflowed sacrificial material.

Optionally, said further MEMS process steps comprise forming an inkjet nozzle containing said suspended beam.

In a second aspect the present invention provides a method of fabricating a plurality of inkjet nozzles on a substrate, each nozzle comprising a nozzle chamber having a roof spaced apart from said substrate and sidewalls extending from said roof to said substrate, one of said sidewalls having a chamber entrance for receiving ink from an ink conduit extending along a row of nozzles, said ink conduit receiving ink from a plurality of ink inlets defined in said substrate, said method comprising the steps of:

(a) providing a substrate having a plurality of trenches corresponding to said ink inlets;

(b) depositing sacrificial material on said substrate so as fill said trenches and form a scaffold on said substrate;

(c) defining openings in said sacrificial material, said openings being positioned to form said chamber sidewalls and said ink conduit when filled with roof material;

(d) depositing roof material over said sacrificial material to form simultaneously said nozzle chambers and said ink conduit;

(e) etching nozzle apertures through said roof material, each nozzle chamber having at least one nozzle aperture; and (f) removing said sacrificial material.

Optionally, each nozzle chamber contains an actuator for ejecting ink through said nozzle aperture.

Optionally, said actuator is formed prior to fabrication of said nozzle chamber.

Optionally, said substrate is a silicon wafer.

Optionally, said silicon wafer comprises at least one surface oxide layer.

Optionally, said sacrificial material is photoresist.

Optionally, said openings are defined by exposing said photoresist through a mask followed by development.

Optionally, said photoresist is UV cured prior to deposition of said roof material, thereby preventing reflow of said photoresist during deposition.

Optionally, said photoresist is removed by plasma ashing.

In a further aspect there is provided a method further comprising the step of etching ink supply channels from an opposite backside of said substrate, said ink supply channels being in fluid communication with said ink inlets.

Optionally, each ink inlet has at least one priming feature extending from a respective rim thereof, and said method further comprises defining at least one opening corresponding to said at least one priming feature in said photoresist.

Optionally, said at least one priming feature comprises a column of roof material extending from said rim.

Optionally, each ink inlet has a plurality of priming features positioned about a respective rim thereof.

Optionally, said plurality of priming features together form a columnar cage extending from said rim.

Optionally, said chamber entrance includes at least one filter structure, and said method further comprises defining at least one opening corresponding to said at least one priming feature in said photoresist.

Optionally, said at least one filter structure comprises a column of roof material extending from said substrate to said roof.

Optionally, each chamber entrance includes a plurality of filter structures arranged across said entrance.

Optionally, each chamber entrance includes a plurality of rows of filter structures arranged across said entrance.

Optionally, said rows of filter structures are staggered.

In a third aspect there is provided a method of fabricating a plurality of inkjet nozzles on a substrate, each nozzle comprising a nozzle chamber having a roof spaced apart from said substrate and sidewalls extending from said roof to said substrate, said chamber having an entrance for receiving ink from at least one ink inlet defined in said substrate, said at least one ink inlet having at least one priming feature extending from a respective rim thereof, said method comprising the steps of:
(a) providing a substrate having a plurality of trenches corresponding to said ink inlets;
(b) depositing sacrificial material on said substrate so as fill said trenches and form a scaffold on said substrate;
(c) defining openings in said sacrificial material, said openings being positioned to form said chamber sidewalls and said at least one priming feature when filled with roof material;
(d) depositing roof material over said sacrificial material to form simultaneously said nozzle chambers and said at least one priming feature;
(e) etching nozzle apertures through said roof material, each nozzle chamber having at least one nozzle aperture; and
(f) removing said sacrificial material.

Optionally, said at least one priming feature comprises a column of roof material extending from said rim.

Optionally, each ink inlet has a plurality of priming features positioned about a respective rim thereof.

Optionally, said plurality of priming features together form a columnar cage extending from said rim.

Optionally, each nozzle chamber contains an actuator for ejecting ink through said nozzle aperture.

Optionally, said actuator is formed prior to fabrication of said nozzle chamber.

Optionally, said substrate is a silicon wafer.

Optionally, said silicon wafer comprises at least one surface oxide layer.

Optionally, said sacrificial material is photoresist.

Optionally, said openings are defined by exposing said photoresist through a mask followed by development.

Optionally, said photoresist is UV cured prior to deposition of said roof material, thereby preventing reflow of said photoresist during deposition.

Optionally, said photoresist is removed by plasma ashing.

In a further aspect there is provided a method further comprising the step of etching ink supply channels from an opposite backside of said substrate, said ink supply channels being in fluid communication with said ink inlets.

Optionally, said chamber entrance is defined in one of said sidewalls of said nozzle chamber.

Optionally, said chamber entrance receives ink from an ink conduit extending along a row of nozzles, whereby step (c) further comprises defining further openings in said sacrificial material, said further openings being positioned to form said ink conduit when filled with roof material.

Optionally, said ink conduit receives ink from said at least one ink inlet.

In a fourth aspect the present invention provides a method of fabricating a plurality of inkjet nozzles on a substrate, each nozzle comprising a nozzle chamber having a roof spaced apart from said substrate and sidewalls extending from said roof to said substrate, one of said sidewalls having a chamber entrance for receiving ink from at least one ink inlet defined in said substrate, said chamber entrance including at least one filter structure, said method comprising the steps of:
(a) providing a substrate having a plurality of trenches corresponding to said ink inlets;
(b) depositing sacrificial material on said substrate so as fill said trenches and form a scaffold on said substrate;
(c) defining openings in said sacrificial material, said openings being positioned to form said chamber sidewalls and said at least one filter structure when filled with roof material;
(d) depositing roof material over said sacrificial material to form simultaneously said nozzle chambers and said at least one filter structure;
(e) etching nozzle apertures through said roof material, each nozzle chamber having at least one nozzle aperture; and
(f) removing said sacrificial material.

Optionally, said filter structure comprises a column of roof material extending from said substrate to said roof.

Optionally, each chamber entrance includes a plurality of filter structures arranged across said entrance.

Optionally, each chamber entrance includes a plurality of rows of filter structures arranged across said entrance.

Optionally, said rows of filter structures are staggered.

Optionally, each nozzle chamber contains an actuator for ejecting ink through said nozzle aperture.

Optionally, said actuator is formed prior to fabrication of said nozzle chamber.

Optionally, said substrate is a silicon wafer.

Optionally, said silicon wafer comprises at least one surface oxide layer.

Optionally, said sacrificial material is photoresist.

Optionally, said openings are defined by exposing said photoresist through a mask followed by development.

Optionally, said photoresist is UV cured prior to deposition of said roof material, thereby preventing reflow of said photoresist during deposition.

Optionally, said photoresist is removed by plasma ashing.

In a further aspect there is provided a method further comprising the step of etching ink supply channels from an opposite backside of said substrate, said ink supply channels being in fluid communication with said ink inlets.

Optionally, said chamber entrance receives ink from an ink conduit extending along a row of nozzles, whereby step (c) further comprises defining further openings in said sacrificial material, said further openings being positioned to form said ink conduit when filled with roof material.

Optionally, said ink conduit receives ink from said at least one ink inlet.

In a fifth aspect the present invention provides a method of forming a low-stiction nozzle plate for an inkjet printhead, said nozzle plate having a plurality of nozzle apertures defined therein, each nozzle aperture having a respective nozzle rim, said method comprising the steps of:
(a) providing a partially-fabricated printhead comprising a plurality of inkjet nozzle assemblies sealed with roof material;
(b) etching partially into said roof material to define simultaneously said nozzle rims and a plurality of stiction-reducing formations; and
(c) etching through said roof material to define said nozzle apertures, thereby forming said nozzle plate.

Optionally, each nozzle rim comprises at least one projection around a perimeter of each nozzle aperture.

Optionally, each nozzle rim comprises a plurality of coaxial projections around a perimeter of each nozzle aperture.

Optionally, said at least one rim projection projects at least 1 micron from said nozzle plate.

Optionally, each stiction-reducing formation comprises a columnar projection on said nozzle plate.

Optionally, each columnar projection projects at least 1 micron from said nozzle plate.

Optionally, each columnar projection is spaced apart from an adjacent columnar projection by less than 2 microns.

Optionally, each stiction-reducing formation comprises an elongate wall projection on said nozzle plate.

Optionally, each wall projection projects at least 1 micron from said nozzle plate.

Optionally, said wall projections are positioned for minimizing color-mixing of inks on said nozzle plate.

Optionally, said wall projections extend along said nozzle plate parallel with rows of nozzles, each nozzle in a row ejecting the same colored ink.

Optionally, the positions of said nozzle rims and said stiction-reducing formations are defined by photolithographic masking.

Optionally, at least half of the surface area of said nozzle plate is tiled with stiction-reducing formations.

Optionally, said inkjet nozzle assemblies are formed on a silicon substrate and said nozzle plate is spaced apart from said substrate.

Optionally, said nozzle plate is comprised of silicon nitride, silicon oxide, silicon oxynitride or aluminium nitride.

Optionally, said nozzle assemblies are sealed by CVD or PECVD deposition of said roof material.

Optionally, said roof material is deposited onto a sacrificial scaffold.

Optionally, each inkjet nozzle assembly has at least one nozzle aperture associated therewith for ejection of ink.

Optionally, said nozzle plate is subsequently treated with a hydrophobizing material.

The printhead according to the invention comprises a plurality of nozzles, as well as a chamber and one or more heater elements corresponding to each nozzle. The smallest repeating units of the printhead will have an ink supply inlet feeding ink to one or more chambers. The entire nozzle array is formed by repeating these individual units. Such an individual unit is referred to herein as a "unit cell".

Also, the term "ink" is used to signify any ejectable liquid, and is not limited to conventional inks containing colored dyes. Examples of non-colored inks include fixatives, infrared absorber inks, functionalized chemicals, adhesives, biological fluids, medicaments, water and other solvents, and so on. The ink or ejectable liquid also need not necessarily be a strictly a liquid, and may contain a suspension of solid particles.

BRIEF DESCRIPTION OF THE DRAWINGS

Preferred embodiments of the present invention will now be described by way of example only with reference to the accompanying drawings, in which.

DETAILED DESCRIPTION OF THE PREFERRED EMBODIMENTS

Figure 1:
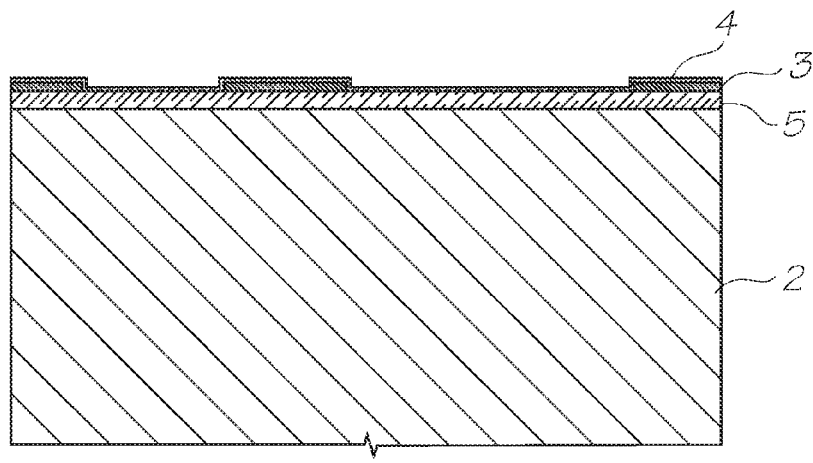
FIG. 1 shows a partially fabricated unit cell of the MEMS nozzle array on a printhead according to the present invention, the unit cell being section along A-A of FIG. 3.

In the description than follows, corresponding reference numerals relate to corresponding parts. For convenience, the features indicated by each reference numeral are listed below.

MNN MPN Series Parts List

| | |
|---|---|
| 1. | Nozzle Unit Cell |
| 2. | Silicon Wafer |
| 3. | Topmost Aluminium Metal Layer in the CMOS metal layers |
| 4. | Passivation Layer |
| 5. | CVD Oxide Layer |
| 6. | Ink Inlet Opening in Topmost Aluminium Metal Layer 3. |
| 7. | Pit Opening in Topmost Aluminium Metal Layer 3. |
| 8. | Pit |
| 9. | Electrodes |
| 10. | SAC1 Photoresist Layer |
| 11. | Heater Material (TiAlN) |
| 12. | Thermal Actuator |
| 13. | Photoresist Layer |
| 14. | Ink Inlet Opening Etched Through Photo Resist Layer |
| 15. | Ink Inlet Passage |
| 16. | SAC2 Photoresist Layer |
| 17. | Chamber Side Wall Openings |
| 18. | Front Channel Priming Feature |
| 19. | Barrier Formation at Ink Inlet |
| 20. | Chamber Roof Layer |
| 21. | Roof |
| 22. | Sidewalls |
| 23. | Ink Conduit |
| 24. | Nozzle Chambers |
| 25. | Elliptical Nozzle Rim |
| | 25(a) Inner Lip |
| | 25(b) Outer Lip |
| 26. | Nozzle Aperture |
| 27. | Ink Supply Channel |
| 28. | Contacts |
| 29. | Heater Element. |
| 30. | Bubble cage |
| 32. | bubble retention structure |

-continued

| | |
|---|---|
| 34. | ink permeable structure |
| 36. | bleed hole |
| 38. | ink chamber |
| 40. | dual row filter |
| 42. | paper dust |
| 44. | ink gutters |
| 46. | gap between SAC1 and trench sidewall |
| 48. | trench sidewall |
| 50. | raised lip of SAC1 around edge of trench |
| 52. | thinner inclined section of heater material |
| 54. | cold spot between series connected heater elements |
| 56. | nozzle plate |
| 58. | columnar projections |
| 60. | sidewall ink opening |
| 62. | ink refill opening |

MEMS Manufacturing Process

Figure 2:
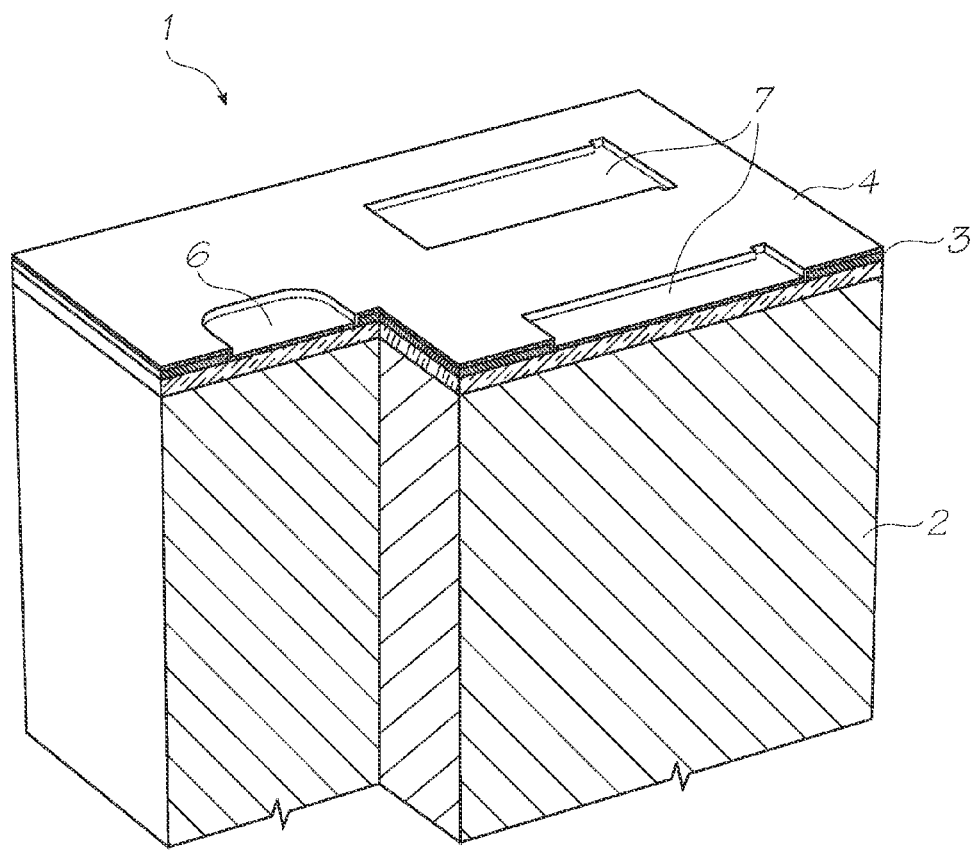
FIG. 2 shows a perspective of the partially fabricated unit cell of FIG. 1.

The MEMS manufacturing process builds up nozzle structures on a silicon wafer after the completion of CMOS processing. FIG. 2 is a cutaway perspective view of a nozzle unit cell 100 after the completion of CMOS processing and before MEMS processing.

During CMOS processing of the wafer, four metal layers are deposited onto a silicon wafer 2, with the metal layers being interspersed between interlayer dielectric (ILD) layers. The four metal layers are referred to as M1, M2, M3 and M4 layers and are built up sequentially on the wafer during CMOS processing. These CMOS layers provide all the drive circuitry and logic for operating the printhead.

In the completed printhead, each heater element actuator is connected to the CMOS via a pair of electrodes defined in the outermost M4 layer. Hence, the M4 CMOS layer is the foundation for subsequent MEMS processing of the wafer. The M4 layer also defines bonding pads along a longitudinal edge of each printhead integrated circuit. These bonding pads (not shown) allow the CMOS to be connected to a microprocessor via wire bonds extending from the bonding pads.

FIGS. 1 and 2 show the aluminium M4 layer 3 having a passivation layer 4 deposited thereon. (Only MEMS features of the M4 layer are shown in these Figures; the main CMOS features of the M4 layer are positioned outside the nozzle unit cell). The M4 layer 3 has a thickness of 1 micron and is itself deposited on a 2 micron layer of CVD oxide 5. As shown in FIGS. 1 and 2, the M4 layer 3 has an ink inlet opening 6 and pit openings 7. These openings define the positions of the ink inlet and pits formed subsequently in the MEMS process.

Before MEMS processing of the unit cell 1 begins, bonding pads along a longitudinal edge of each printhead integrated circuit are defined by etching through the passivation layer 4. This etch reveals the M4 layer 3 at the bonding pad positions. The nozzle unit cell 1 is completely masked with photoresist for this step and, hence, is unaffected by the etch.

Figure 3:
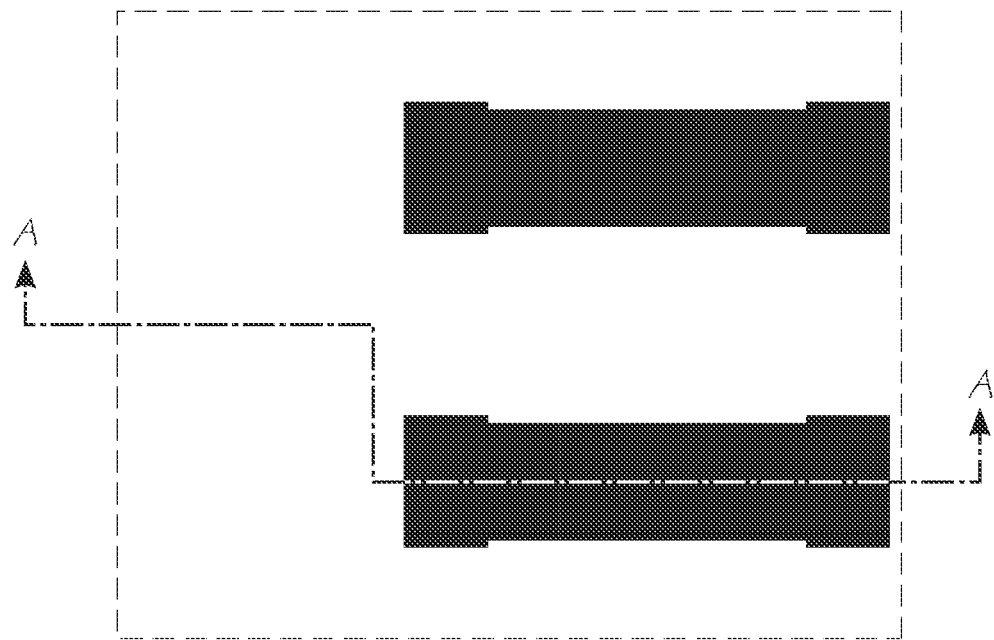
FIG. 3 shows the mark associated with the etch of the heater element trench.
Figure 4:
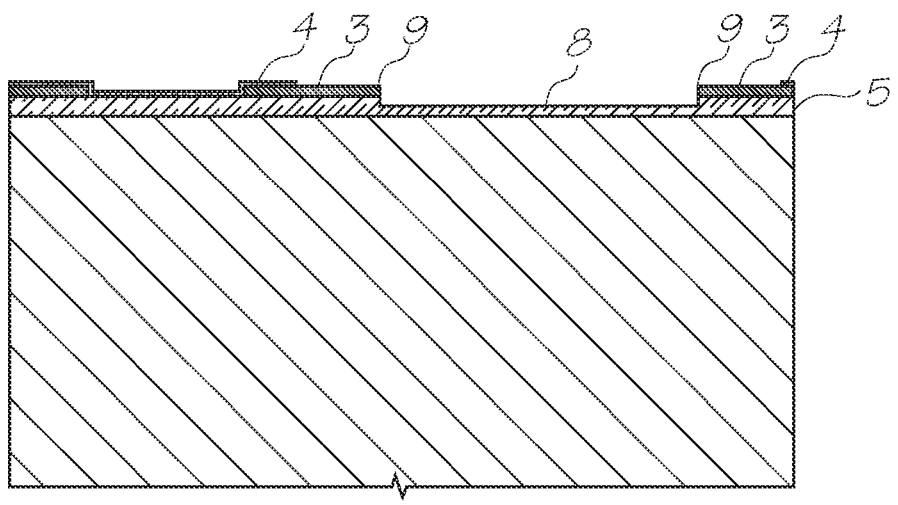
FIG. 4 is a sectioned view of the unit cell after the etch of the trench.
Figure 5:
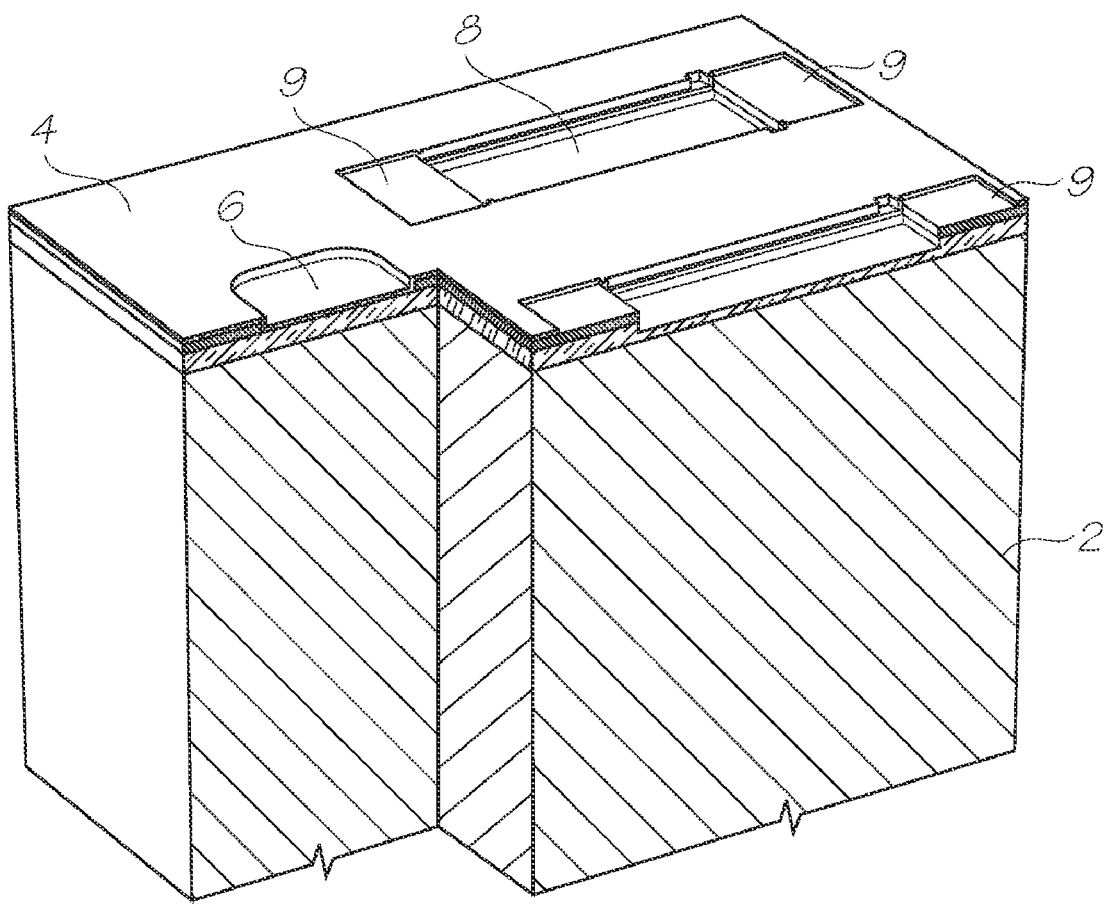
FIG. 5 is a perspective view of the unit cell shown in FIG. 4.

Turning to FIGS. 3 to 5, the first stage of MEMS processing etches a pit 8 through the passivation layer 4 and the CVD oxide layer 5. This etch is defined using a layer of photoresist (not shown) exposed by the dark tone pit mask shown in FIG. 3. The pit 8 has a depth of 2 microns, as measured from the top of the M4 layer 3. At the same time as etching the pit 8, electrodes 9 are defined on either side of the pit by partially revealing the M4 layer 3 through the passivation layer 4. In the completed nozzle, a heater element is suspended across the pit 8 between the electrodes 9.

In the next step (FIGS. 6 to 8), the pit 8 is filled with a first sacrificial layer ("SAC1") of photoresist 10. A 2 micron layer of high viscosity photoresist is first spun onto the wafer and then exposed using the dark tone mask shown in FIG. 6. The SAC1 photoresist 10 forms a scaffold for subsequent deposition of the heater material across the electrodes 9 on either side of the pit 8. Consequently, it is important the SAC1 photoresist 10 has a planar upper surface that is flush with the upper surface of the electrodes 9. At the same time, the SAC1 photoresist must completely fill the pit 8 to avoid 'stringers' of conductive heater material extending across the pit and shorting out the electrodes 9.

Typically, when filling trenches with photoresist, it is necessary to expose the photoresist outside the perimeter of the trench in order to ensure that photoresist fills against the walls of the trench and, therefore, avoid 'stringers' in subsequent deposition steps. However, this technique results in a raised (or spiked) rim of photoresist around the perimeter of the trench. This is undesirable because in a subsequent deposition step, material is deposited unevenly onto the raised rim—vertical or angled surfaces on the rim will receive less deposited material than the horizontal planar surface of the photoresist filling the trench. The result is 'resistance hotspots' in regions where material is thinly deposited.

Figure 6:
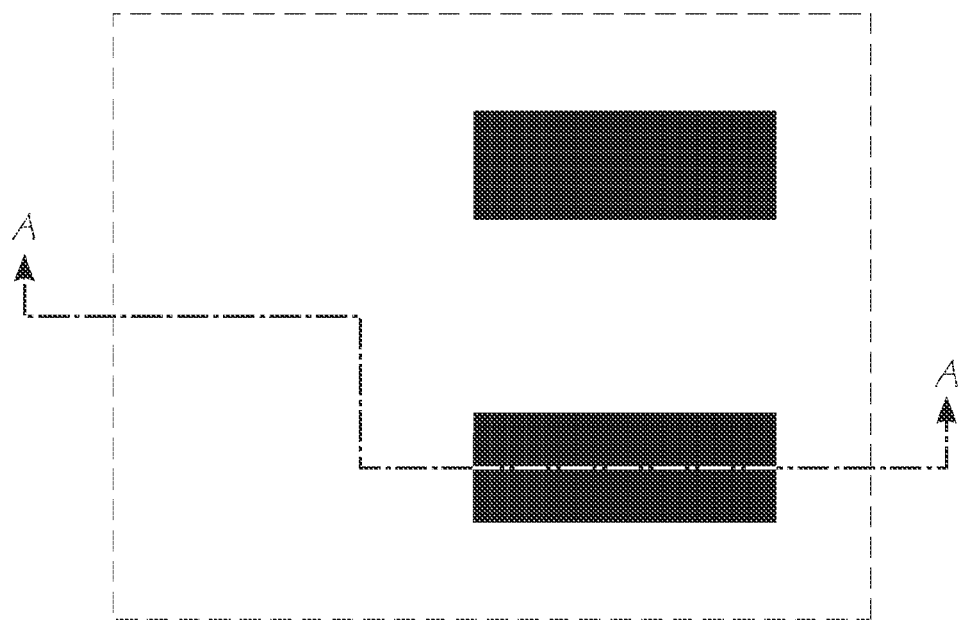
FIG. 6 is the mask associated with the deposition of sacrificial photoresist shown in FIG. 7.
Figure 7:
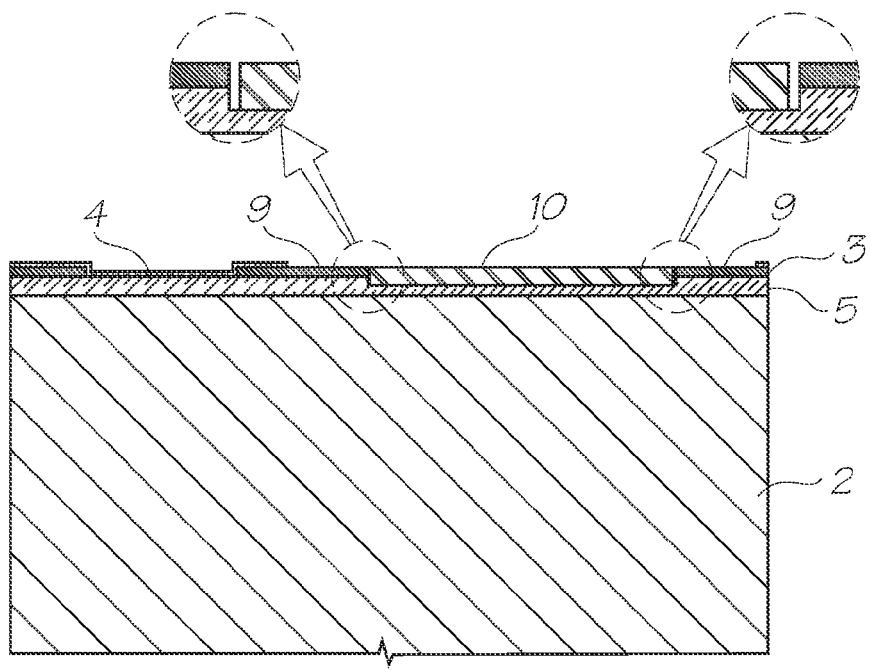
FIG. 7 shows the unit cell after the deposition of sacrificial photoresist trench, with partial enlargements of the gaps between the edges of the sacrificial material and the side walls of the trench.
Figure 8:
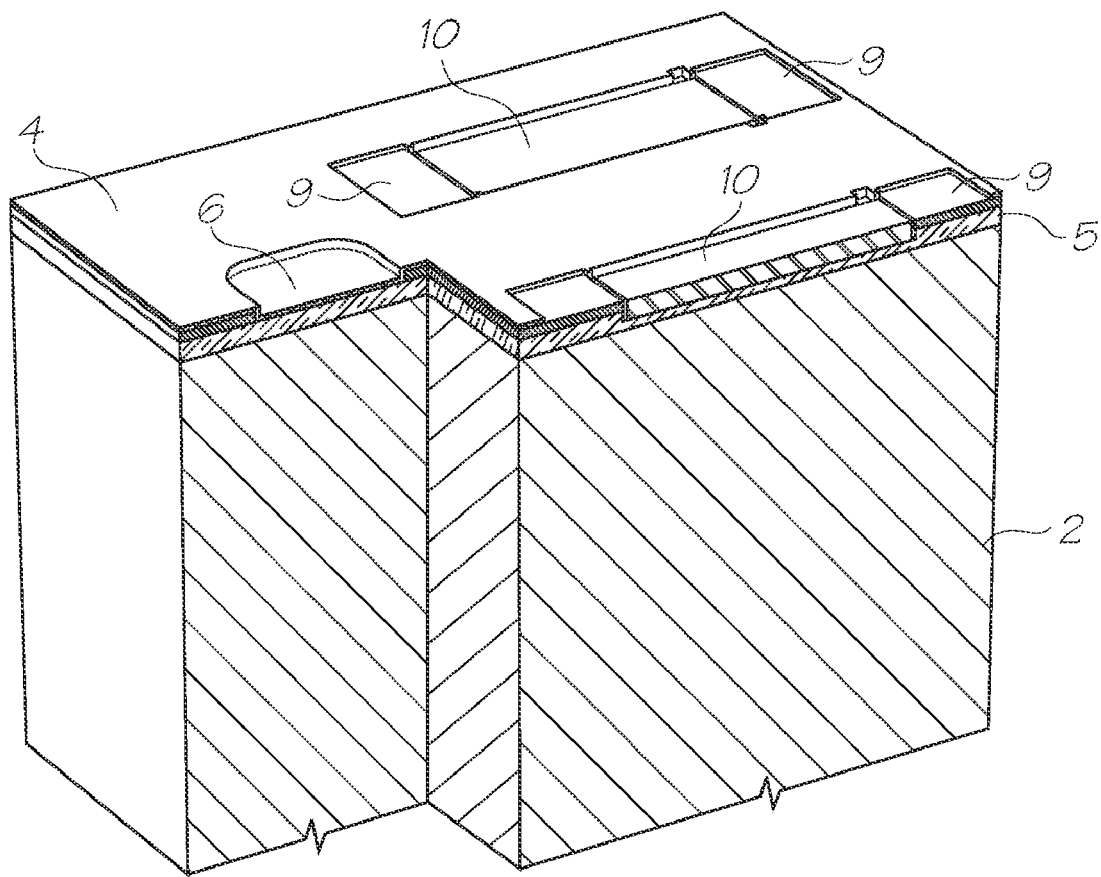
FIG. 8 is a perspective of the unit cell shown in FIG. 7.

As shown in FIG. 7, the present process deliberately exposes the SAC1 photoresist 10 inside the perimeter walls of the pit 8 (e.g. within 0.5 microns) using the mask shown in FIG. 6. This ensures a planar upper surface of the SAC1 photoresist 10 and avoids any spiked regions of photoresist around the perimeter rim of the pit 8.

Figure 9:
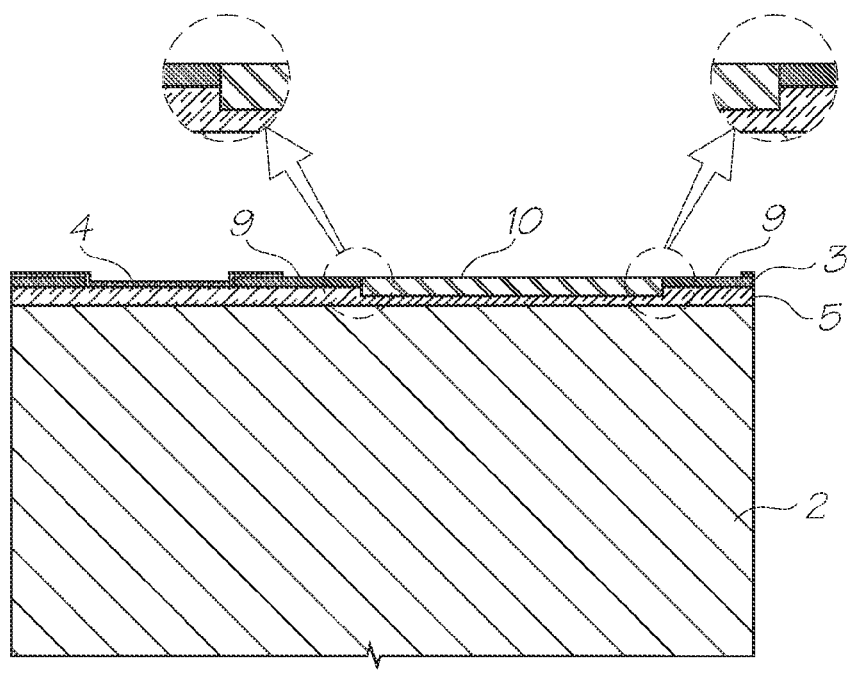
FIG. 9 shows the unit cell following the reflow of the sacrificial photoresist to close the gaps along the side walls of the trench.
Figure 10:
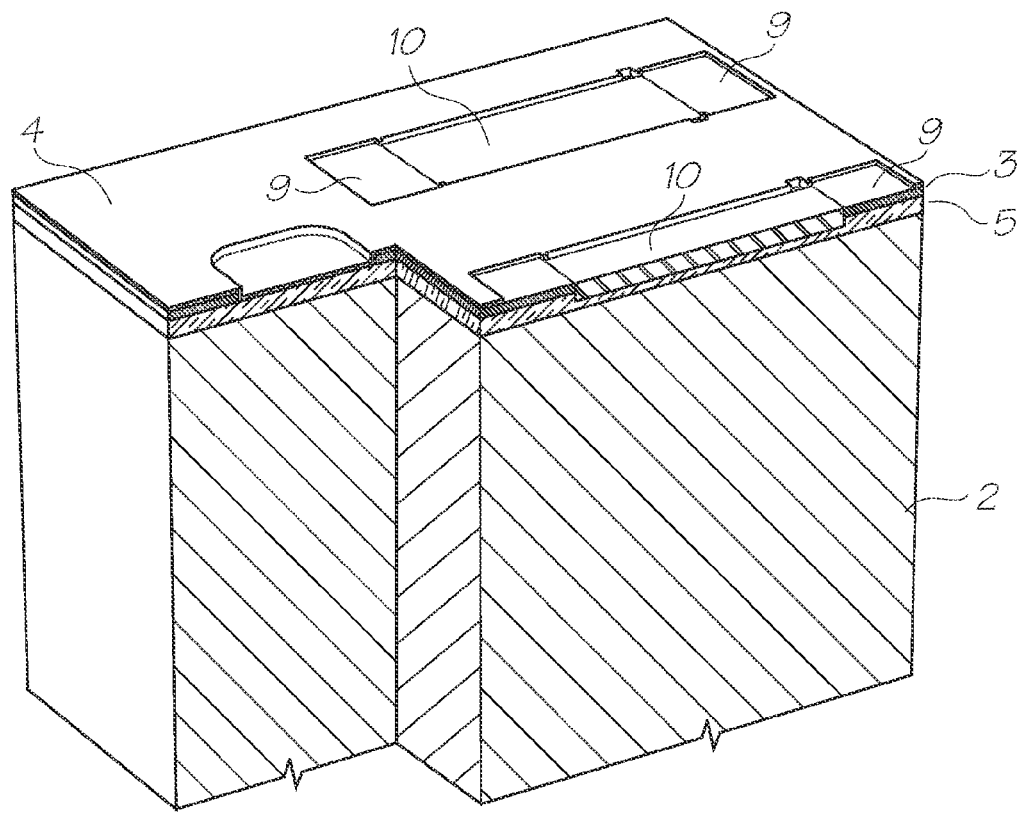
FIG. 10 is a perspective of the unit cell shown in FIG. 9.

After exposure of the SAC1 photoresist 10, the photoresist is reflowed by heating. Reflowing the photoresist allows it to flow to the walls of the pit 8, filling it exactly. FIGS. 9 and 10 show the SAC1 photoresist 10 after reflow. The photoresist has a planar upper surface and meets flush with the upper surface of the M4 layer 3, which forms the electrodes 9. Following reflow, the SAC1 photoresist 10 is U.V. cured and/or hardbaked to avoid any reflow during the subsequent deposition step of heater material.

Figure 11:
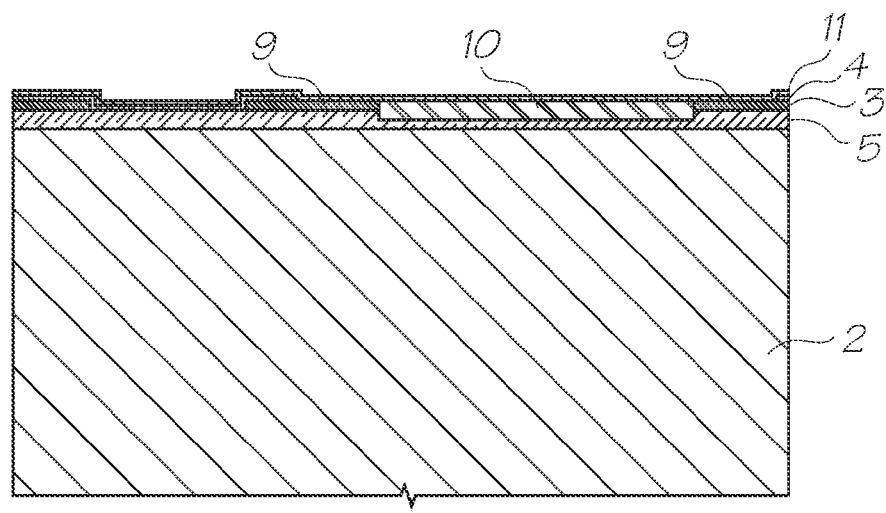
FIG. 11 is a section view showing the deposition of the heater material layer.
Figure 12:
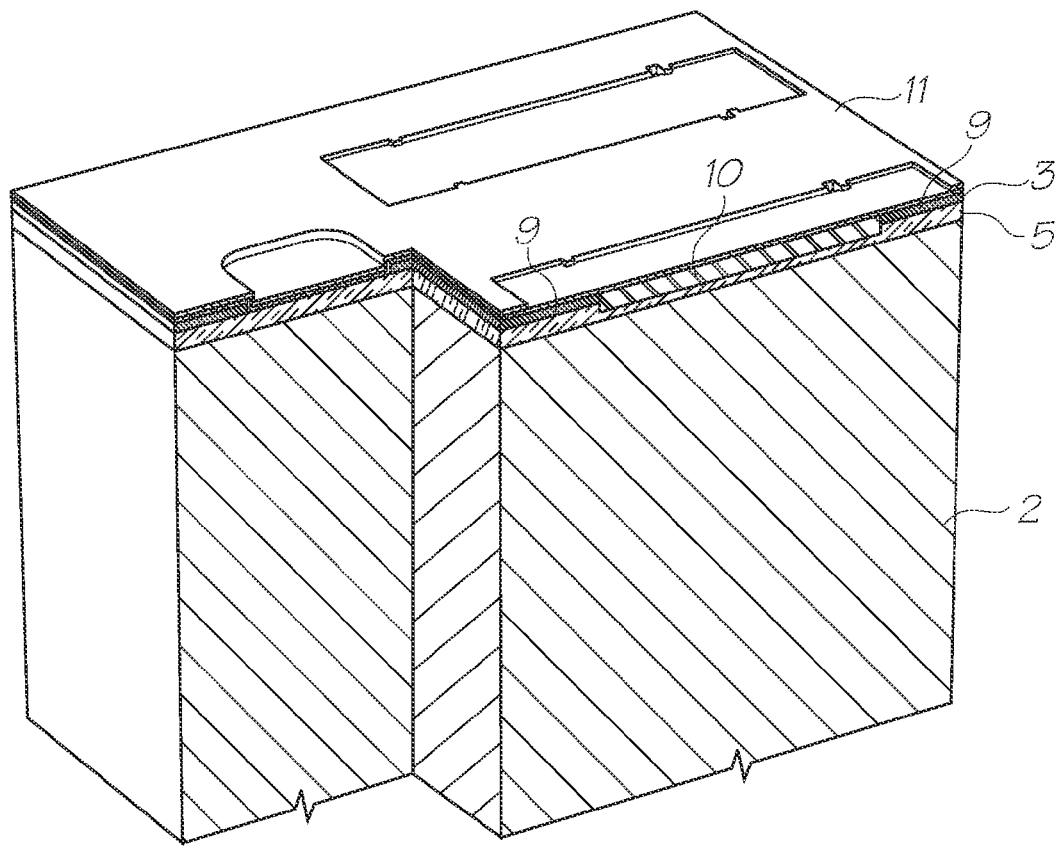
FIG. 12 is a perspective of the unit cell shown in FIG. 11.

FIGS. 11 and 12 show the unit cell after deposition of the 0.5 microns of heater material 11 onto the SAC1 photoresist 10. Due to the reflow process described above, the heater material 11 is deposited evenly and in a planar layer over the electrodes 9 and the SAC1 photoresist 10. The heater material may be comprised of any suitable conductive material, such as TiAl, TiN, TiAlN, TiAlSiN etc. A typical heater material deposition process may involve sequential deposition of a 100 Å seed layer of TiAl, a 2500 Å layer of TiAlN, a further 100 Å seed layer of TiAl and finally a further 2500 Å layer of TiAlN.

Figure 13:
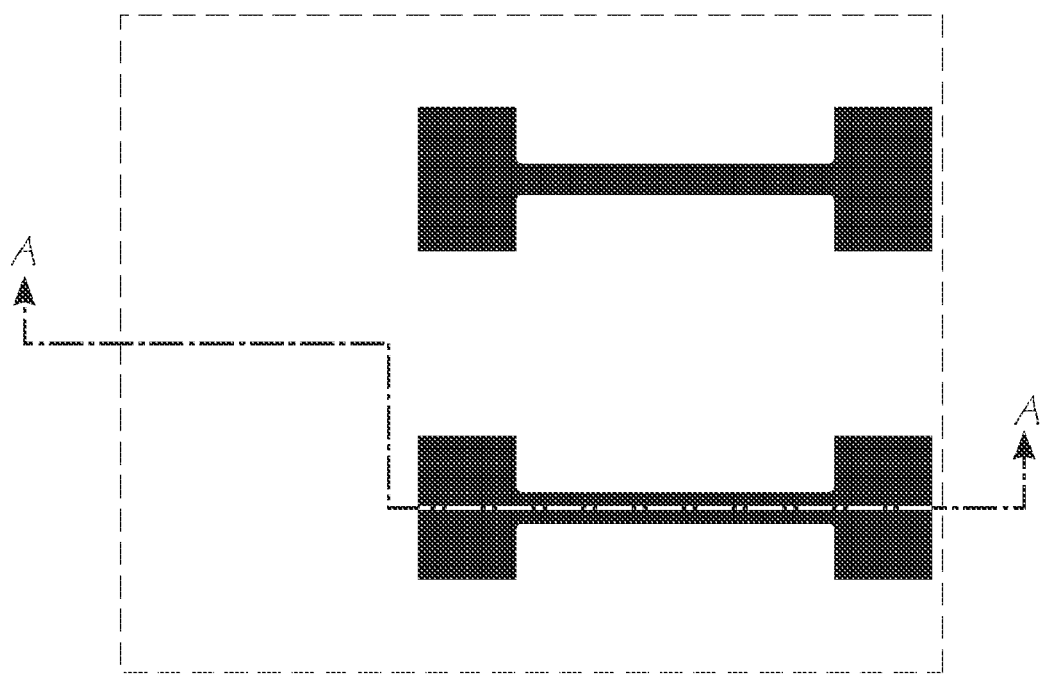
FIG. 13 is the mask associated with the metal etch of the heater material shown in FIG. 14.
Figure 14:
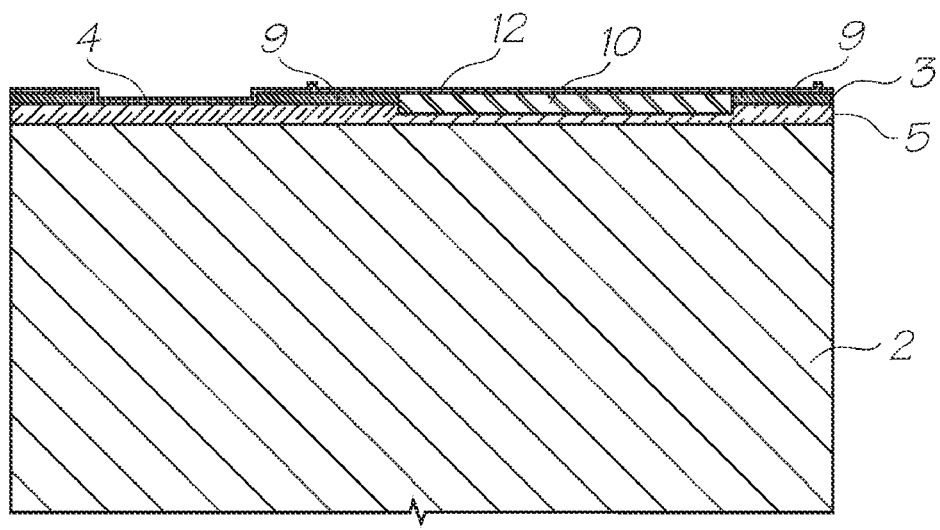
FIG. 14 is a section view showing the metal etch to shape the heater actuators.
Figure 15:
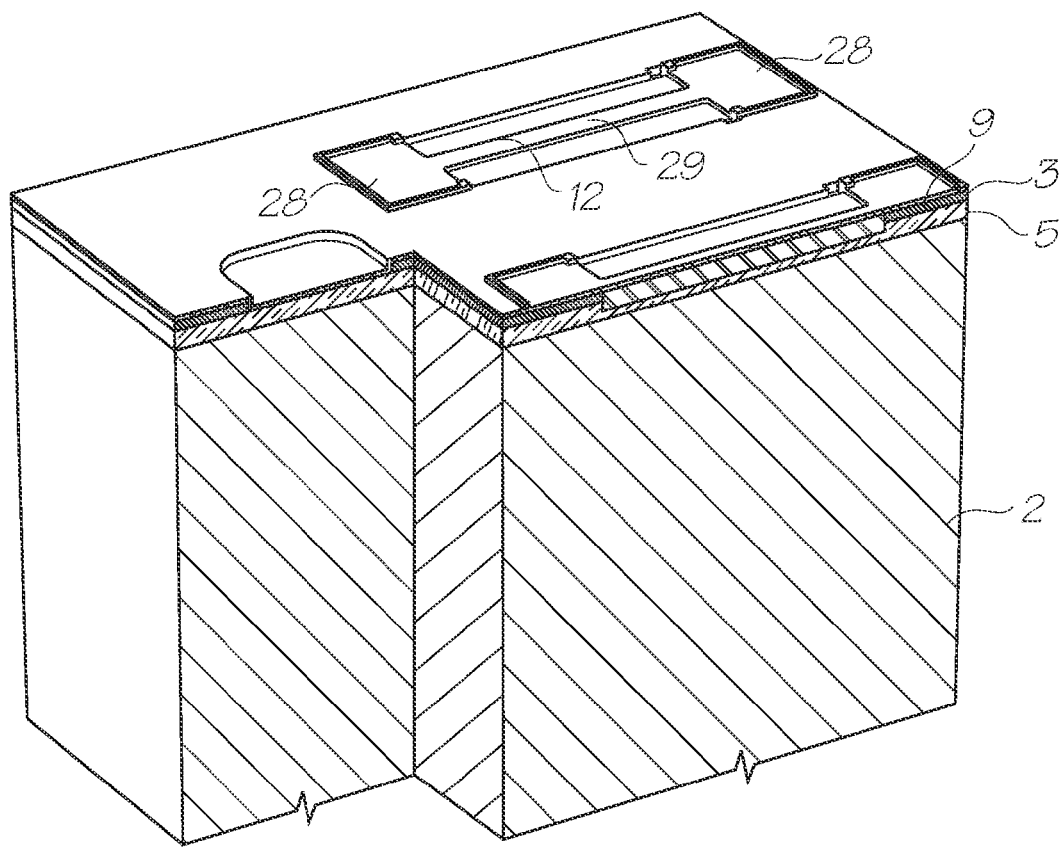
FIG. 15 is a perspective of the unit cell shown in FIG. 14.

Referring to FIGS. 13 to 15, in the next step, the layer of heater material 11 is etched to define the thermal actuator 12. Each actuator 12 has contacts 28 that establish an electrical connection to respective electrodes 9 on either side of the SAC1 photoresist 10. A heater element 29 spans between its corresponding contacts 28.

This etch is defined by a layer of photoresist (not shown) exposed using the dark tone mask shown in FIG. 13. As shown in FIG. 15, the heater element 12 is a linear beam spanning between the pair of electrodes 9. However, the heater element 12 may alternatively adopt other configurations, such as those described in Applicant's U.S. Pat. No. 6,755,509, the content of which is herein incorporated by reference. For example, heater element 29 configurations having a central void may be advantageous for minimizing the deleterious effects of cavitation forces on the heater material when a bubble collapses during ink ejection. Other forms of cavitation protection may be adopted such as 'bubble venting' and the use of self passivating materials. These cavitation management techniques are discussed in detail in U.S. patent application (11/097,308).

In the next sequence of steps, an ink inlet for the nozzle is etched through the passivation layer 4, the oxide layer 5 and the silicon wafer 2. During CMOS processing, each of the metal layers had an ink inlet opening (see, for example, opening 6 in the M4 layer 3 in FIG. 1) etched therethrough in preparation for this ink inlet etch. These metal layers, together with the interspersed ILD layers, form a seal ring for the ink inlet, preventing ink from seeping into the CMOS layers.

Figure 16:
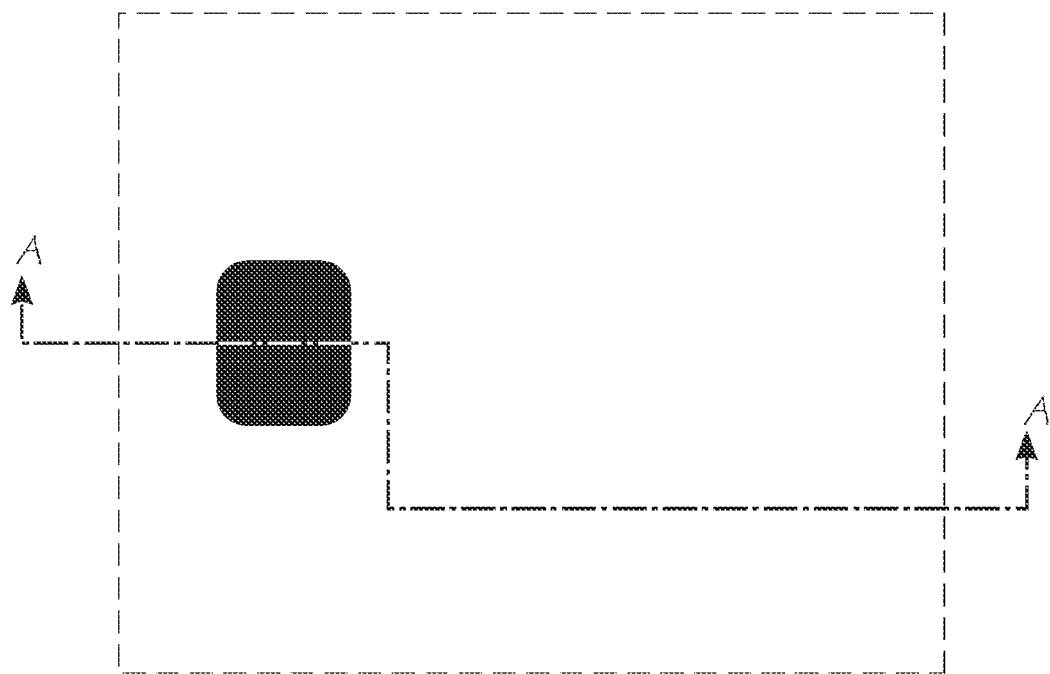
FIG. 16 is the mask associated with the etch shown in FIG. 17.
Figure 17:
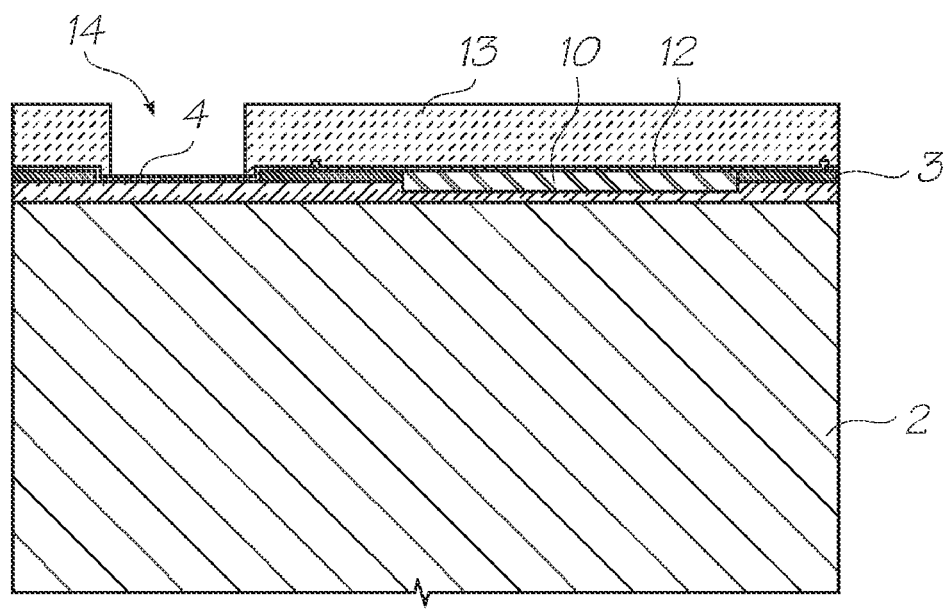
FIG. 17 shows the deposition of the photoresist layer and subsequent etch of the ink inlet to the passivation layer on top of the CMOS drive layers.
Figure 18:
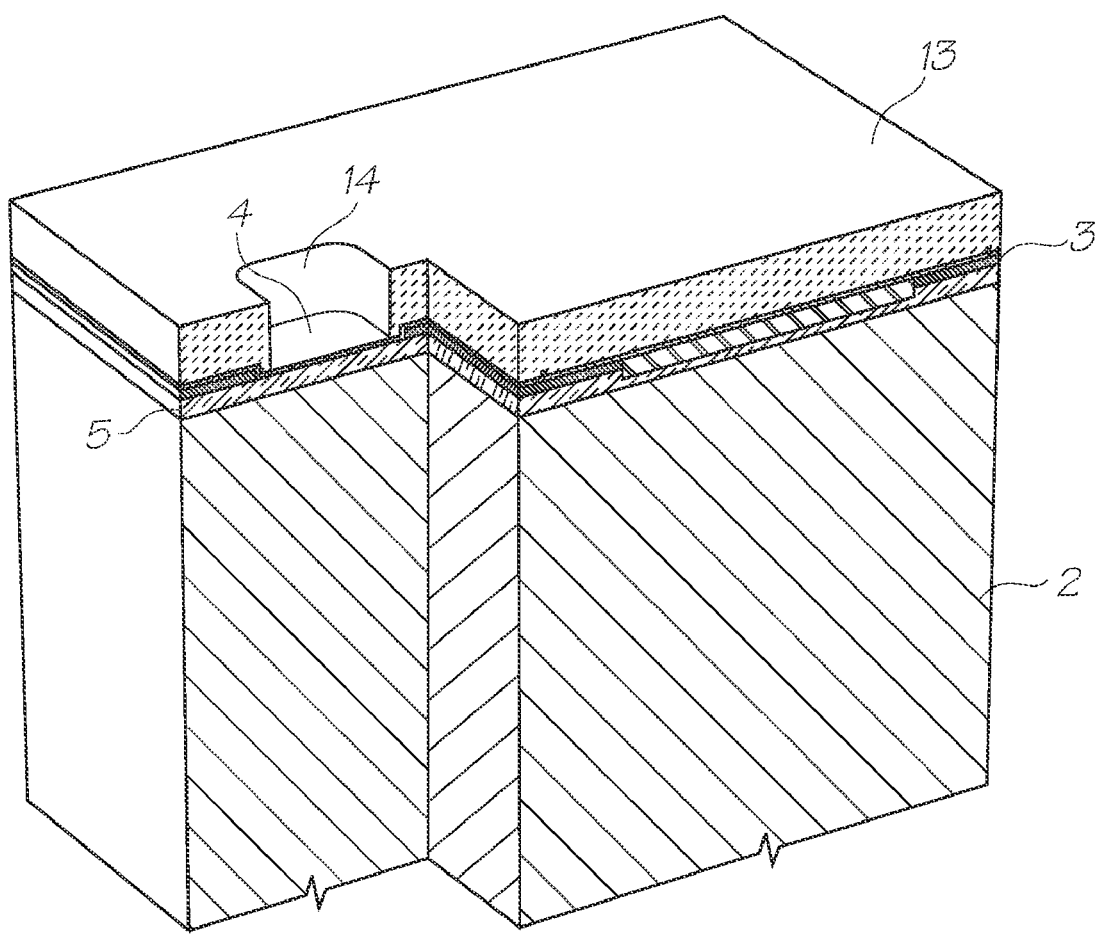
FIG. 18 is a perspective of the unit cell shown in FIG. 17.

Referring to FIGS. 16 to 18, a relatively thick layer of photoresist 13 is spun onto the wafer and exposed using the dark tone mask shown in FIG. 16. The thickness of photoresist 13 required will depend on the selectivity of the deep reactive ion etch (DRIE) used to etch the ink inlet. With an ink inlet opening 14 defined in the photoresist 13, the wafer is ready for the subsequent etch steps.

Figure 19:
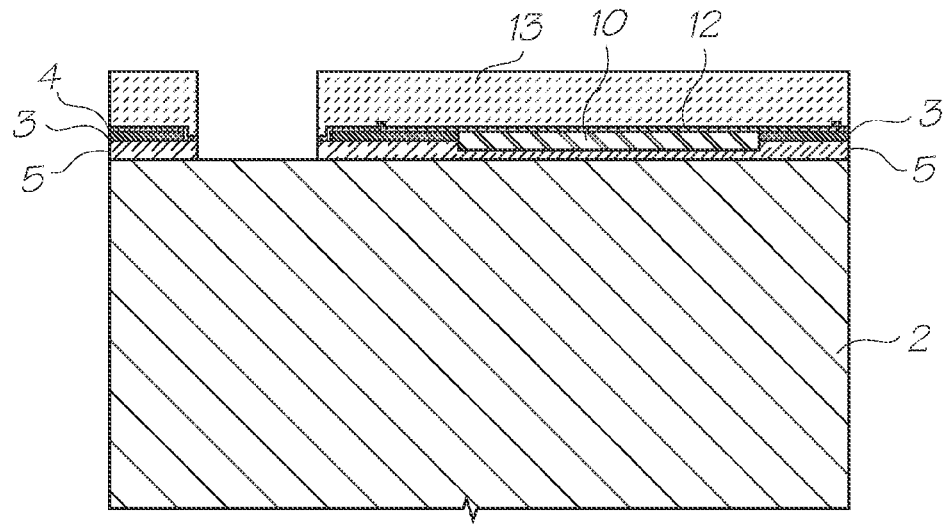
FIG. 19 shows the oxide etch through the passivation and CMOS layers to the underlying silicon wafer.
Figure 20:
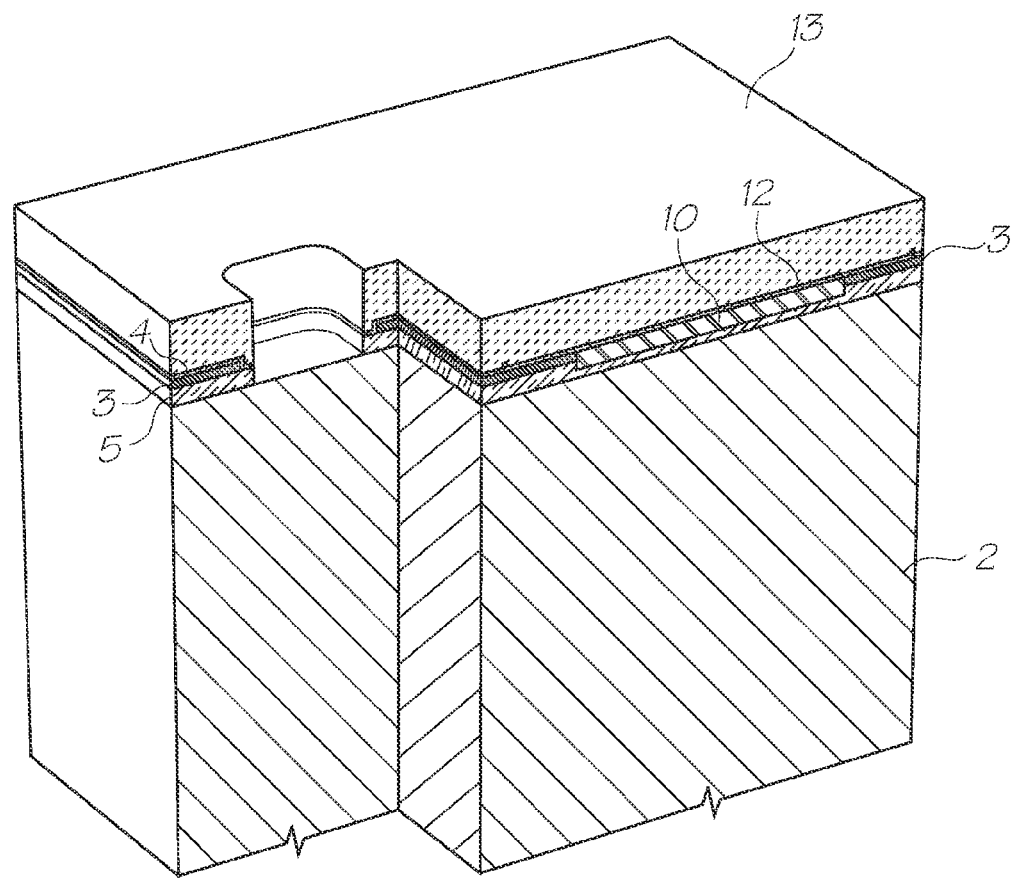
FIG. 20 is a perspective of the unit cell shown in FIG. 19.

In the first etch step (FIGS. 19 and 20), the dielectric layers (passivation layer 4 and oxide layer 5) are etched through to the silicon wafer below. Any standard oxide etch (e.g. $O_2/C_4F_8$ plasma) may be used.

Figure 21:
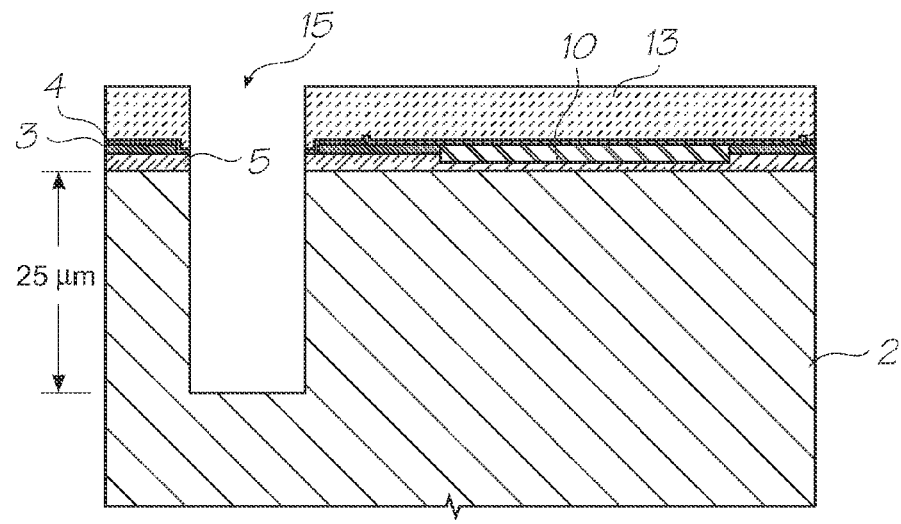
FIG. 21 is the deep anisotropic etch of the ink inlet into the silicon wafer.
Figure 22:
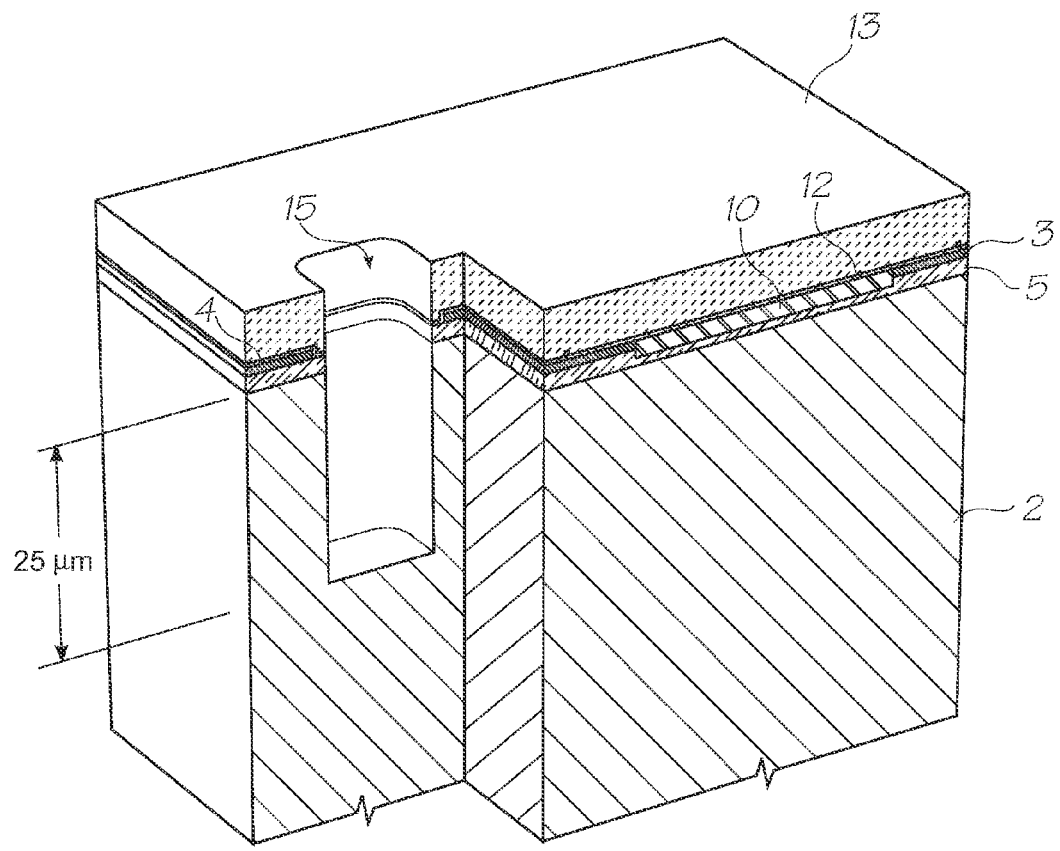
FIG. 22 is a perspective of the unit cell shown in FIG. 21.

In the second etch step (FIGS. 21 and 22), an ink inlet 15 is etched through the silicon wafer 2 to a depth of 25 microns, using the same photoresist mask 13. Any standard anisotropic DRIE, such as the Bosch etch (see U.S. Pat. Nos. 6,501,893 and 6,284,148) may be used for this etch. Following etching of the ink inlet 15, the photoresist layer 13 is removed by plasma ashing.

Figure 23:
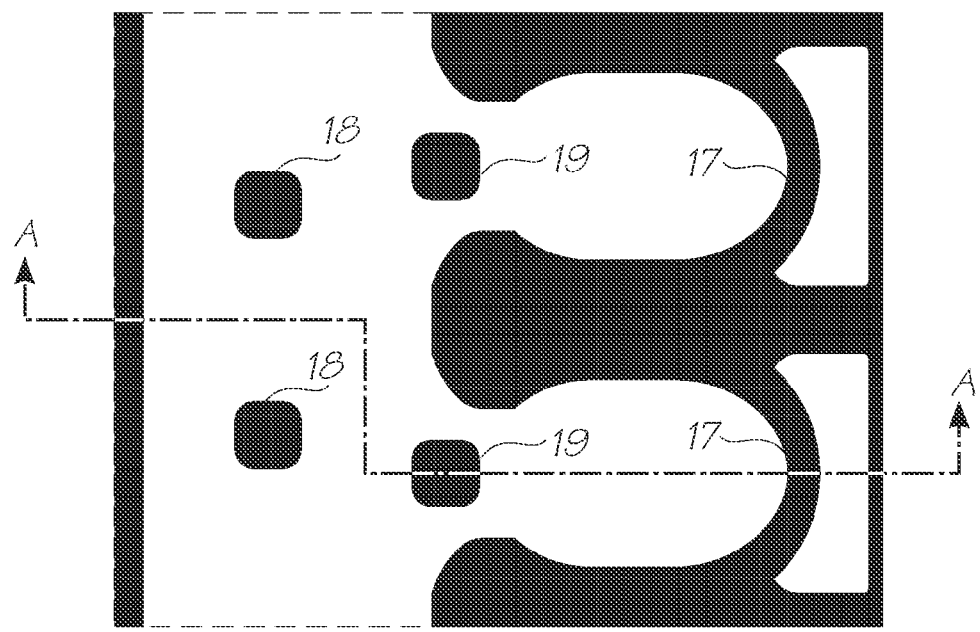
FIG. 23 is the mask associated with the photoresist etch shown in FIG. 24.
Figure 24:
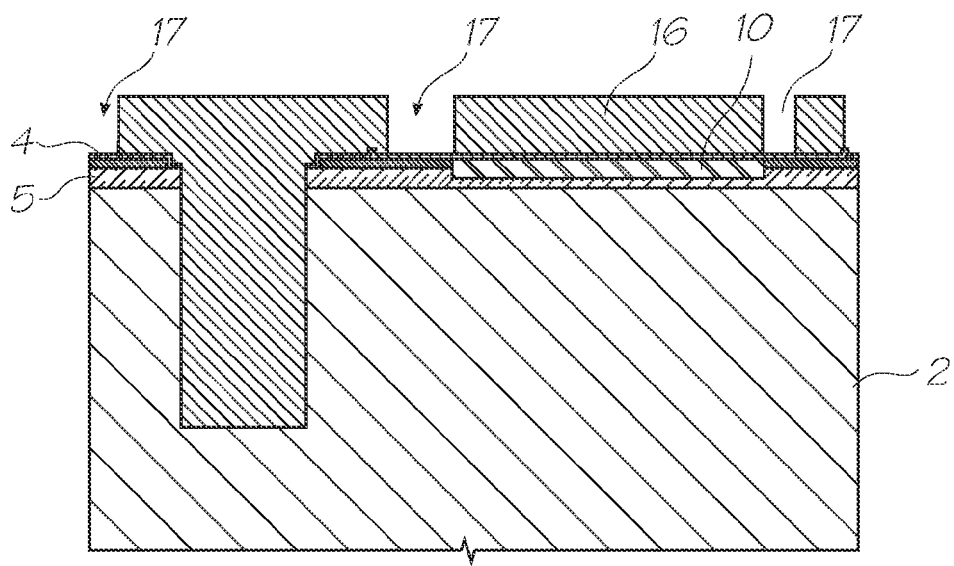
FIG. 24 shows the photoresist etch to form openings for the chamber roof and side walls.
Figure 25:
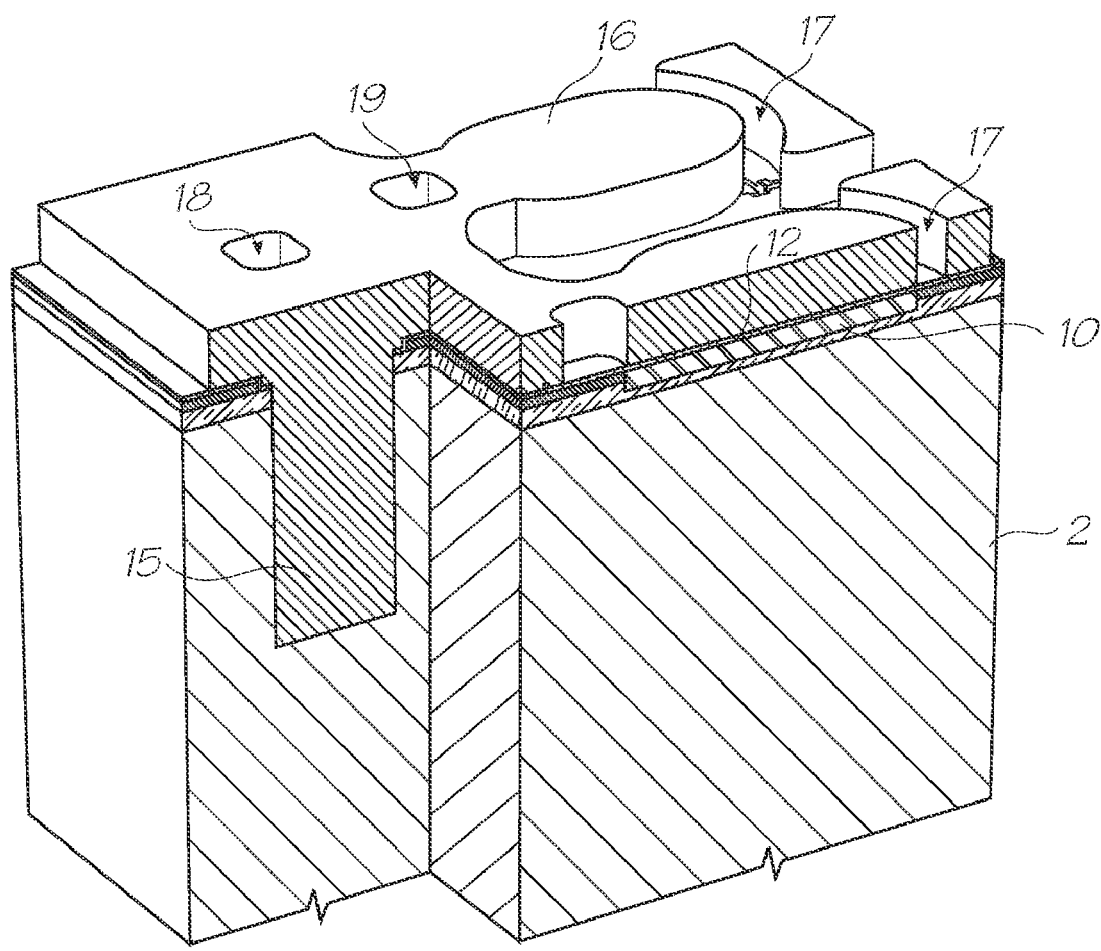
FIG. 25 is a perspective of the unit cell shown in FIG. 24.

In the next step, the ink inlet 15 is plugged with photoresist and a second sacrificial layer ("SAC2") of photoresist 16 is built up on top of the SAC1 photoresist 10 and passivation layer 4. The SAC2 photoresist 16 will serve as a scaffold for subsequent deposition of roof material, which forms a roof and sidewalls for each nozzle chamber. Referring to FIGS. 23 to 25, a ~6 micron layer of high viscosity photoresist is spun onto the wafer and exposed using the dark tone mask shown in FIG. 23.

As shown in FIGS. 23 and 25, the mask exposes sidewall openings 17 in the SAC2 photoresist 16 corresponding to the positions of chamber sidewalls and sidewalls for an ink conduit. In addition, openings 18 and 19 are exposed adjacent the plugged inlet 15 and nozzle chamber entrance respectively. These openings 18 and 19 will be filled with roof material in the subsequent roof deposition step and provide unique advantages in the present nozzle design. Specifically, the openings 18 filled with roof material act as priming features, which assist in drawing ink from the inlet 15 into each nozzle chamber. This is described in greater detail below. The openings 19 filled with roof material act as filter structures and fluidic cross talk barriers. These help prevent air bubbles from entering the nozzle chambers and diffuses pressure pulses generated by the thermal actuator 12.

Figure 26:
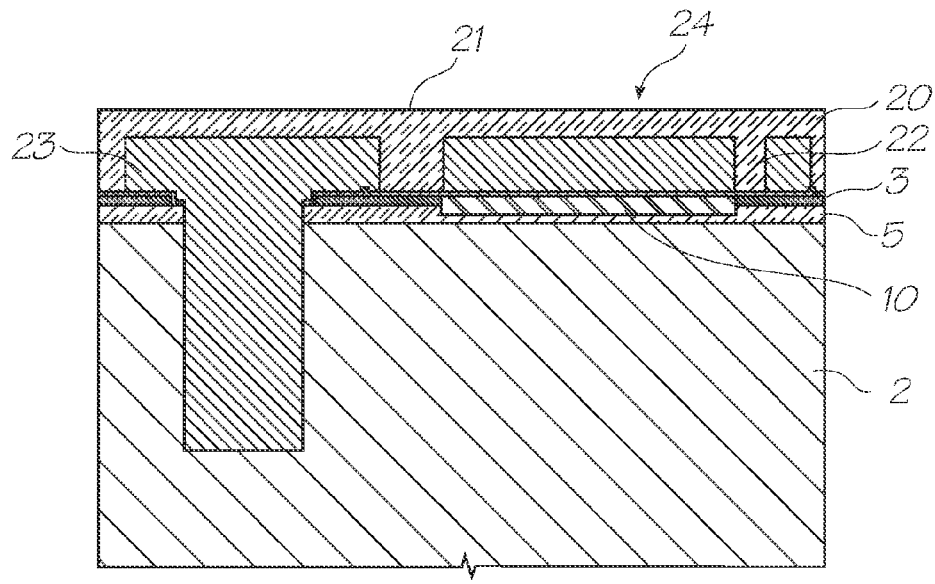
FIG. 26 shows the deposition of the side wall and risk material.
Figure 27:
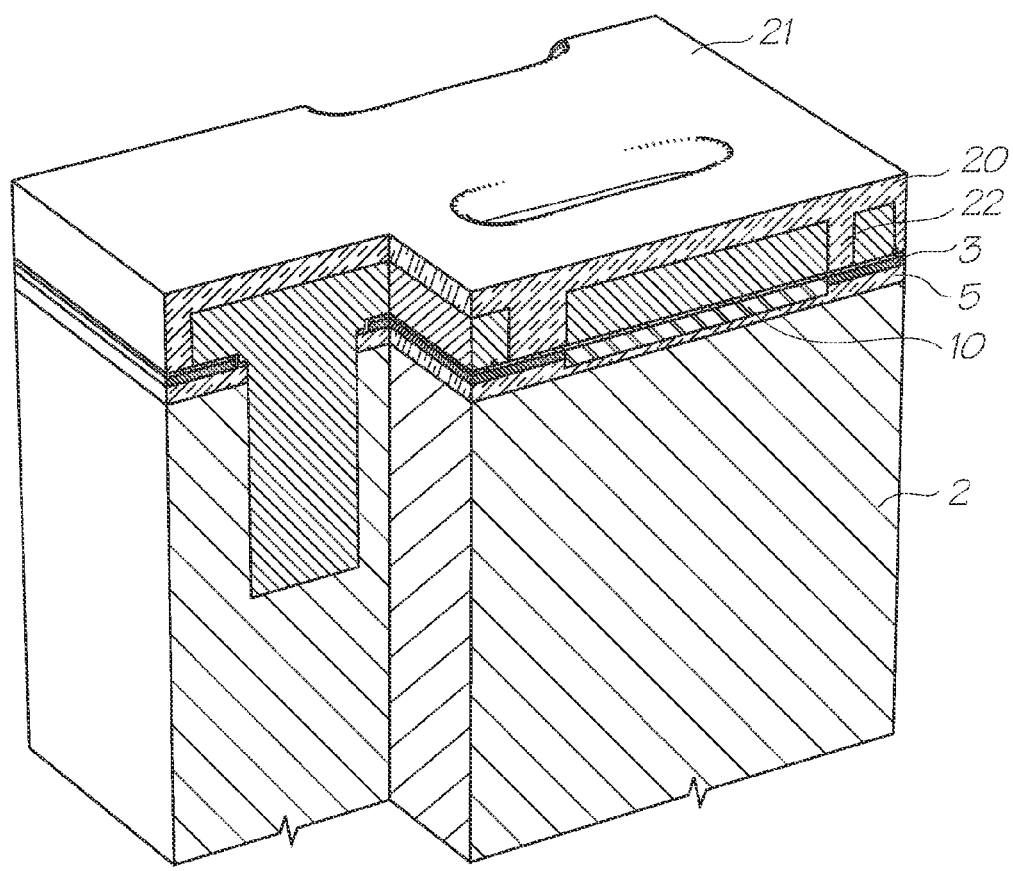
FIG. 27 is a perspective of the unit cell shown in FIG. 26.

Referring to FIGS. 26 and 27, the next stage deposits 3 microns of roof material 20 onto the SAC2 photoresist 16 by PECVD. The roof material 20 fills the openings 17, 18 and 19 in the SAC2 photoresist 16 to form nozzle chambers 24 having a roof 21 and sidewalls 22. An ink conduit 23 for supplying ink into each nozzle chamber is also formed during deposition of the roof material 20. In addition, any priming features and filter structures (not shown in FIGS. 26 and 27) are formed at the same time. The roofs 21, each corresponding to a respective nozzle chamber 24, span across adjacent nozzle chambers in a row to form a continuous nozzle plate. The roof material 20 may be comprised of any suitable material, such as silicon nitride, silicon oxide, silicon oxynitride, aluminium nitride etc.

Figure 28:
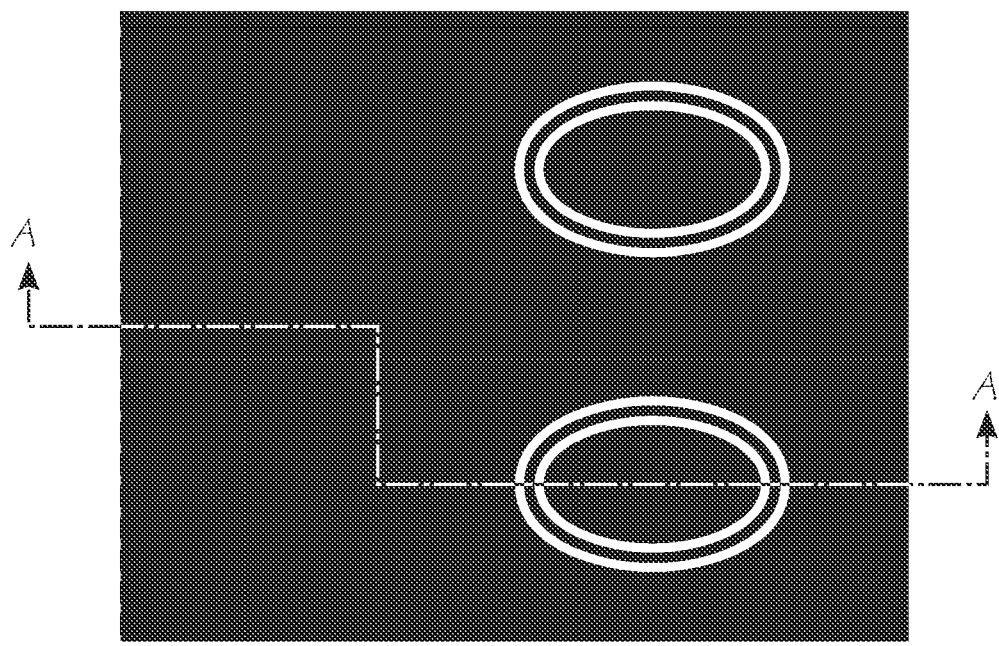
FIG. 28 is the mask associated with the nozzle rim etch shown in FIG. 29.
Figure 29:
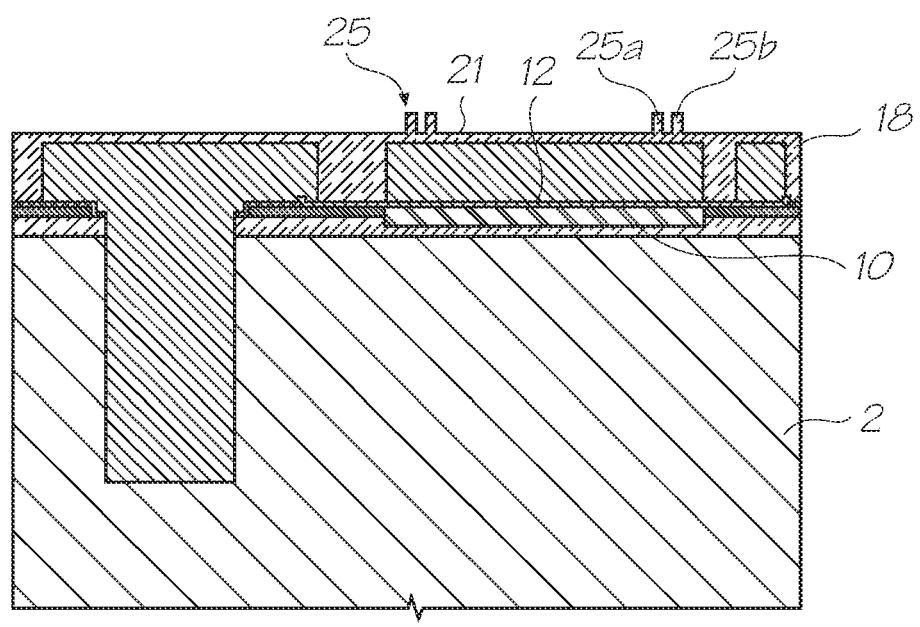
FIG. 29 shows the etch of the roof layer to form the nozzle aperture rim.
Figure 30:
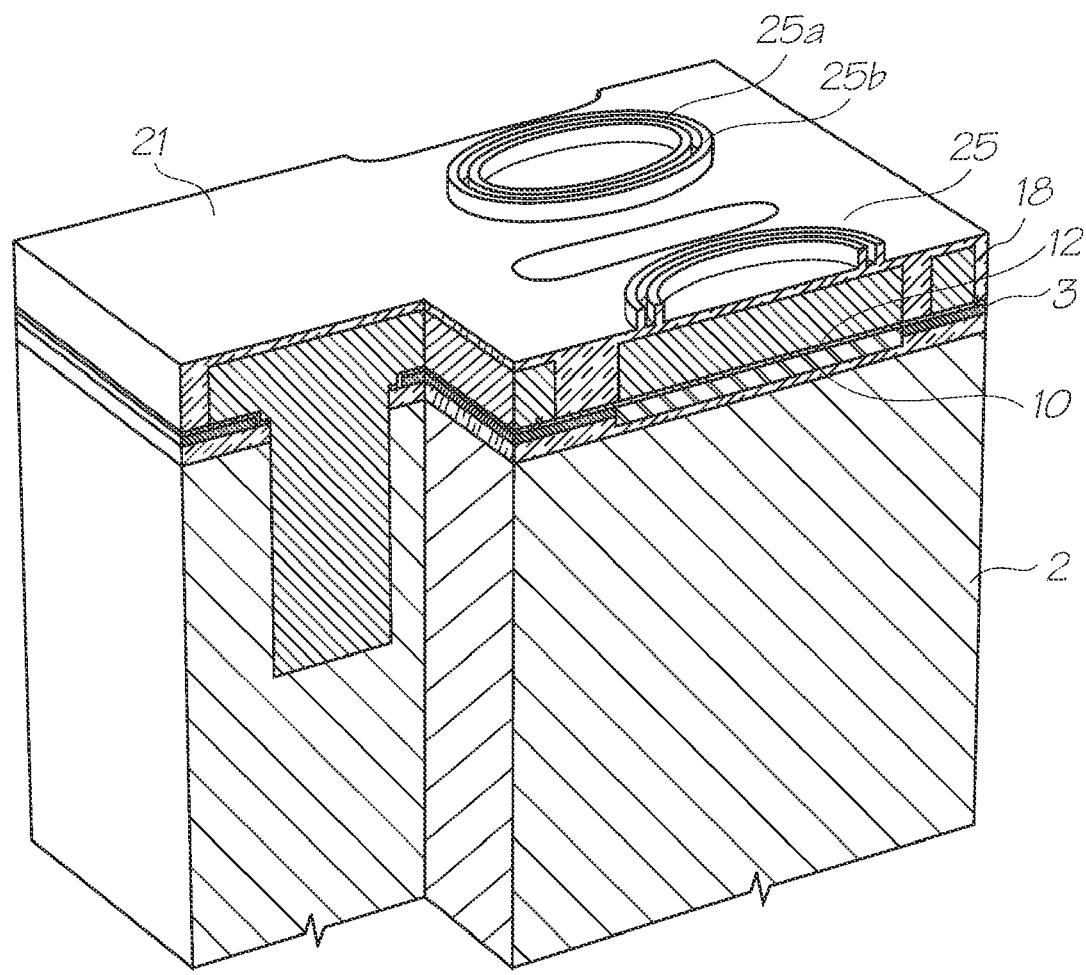
FIG. 30 is a perspective of the unit cell shown in FIG. 29.

Referring to FIGS. 28 to 30, the next stage defines an elliptical nozzle rim 25 in the roof 21 by etching away 2 microns of roof material 20. This etch is defined using a layer of photoresist (not shown) exposed by the dark tone rim mask shown in FIG. 28. The elliptical rim 25 comprises two coaxial rim lips 25a and 25b, positioned over their respective thermal actuator 12.

Figure 31:
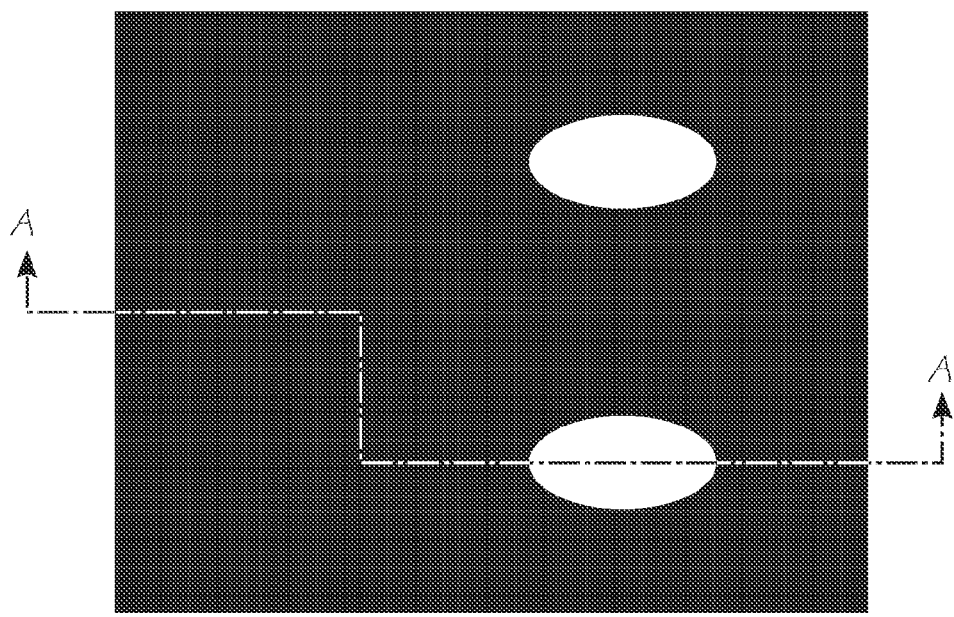
FIG. 31 is the mask associated with the nozzle aperture etch shown in FIG. 32.
Figure 32:
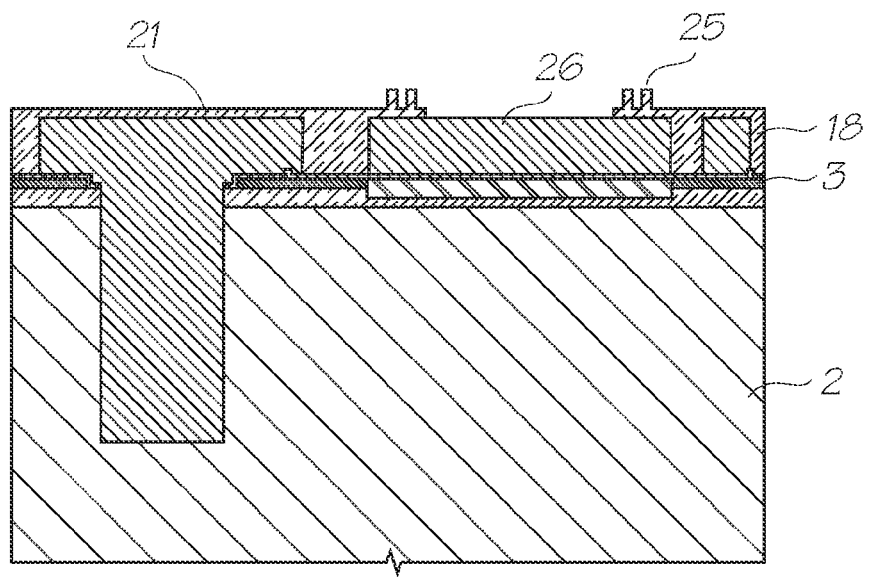
FIG. 32 shows the etch of the roof material to form the elliptical nozzle apertures.
Figure 33:
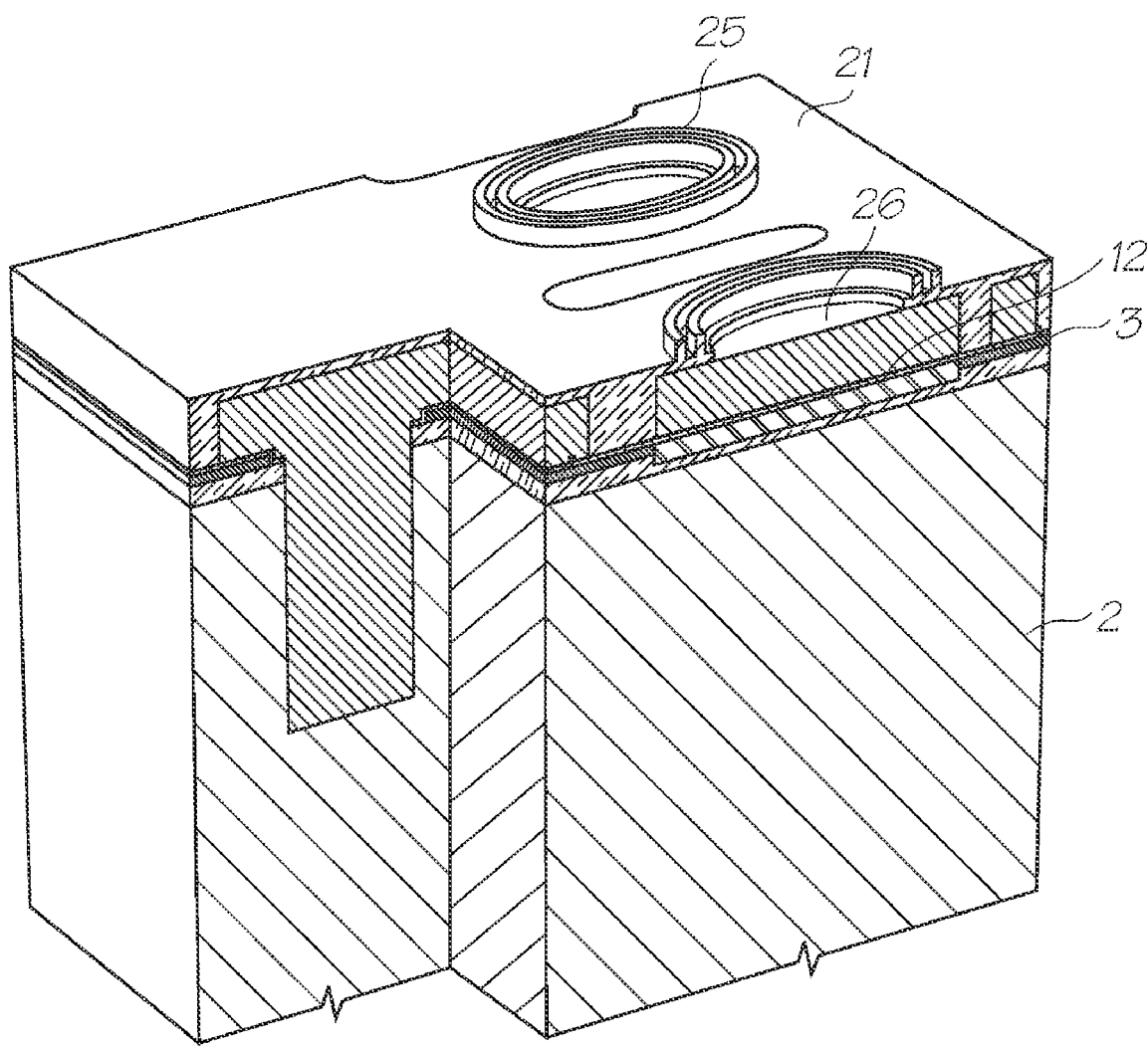
FIG. 33 is a perspective of the unit cell shown in FIG. 32.

Referring to FIGS. 31 to 33, the next stage defines an elliptical nozzle aperture 26 in the roof 21 by etching all the way through the remaining roof material 20, which is bounded by the rim 25. This etch is defined using a layer of photoresist (not shown) exposed by the dark tone roof mask shown in FIG. 31. The elliptical nozzle aperture 26 is positioned over the thermal actuator 12, as shown in FIG. 33.

Figure 34:
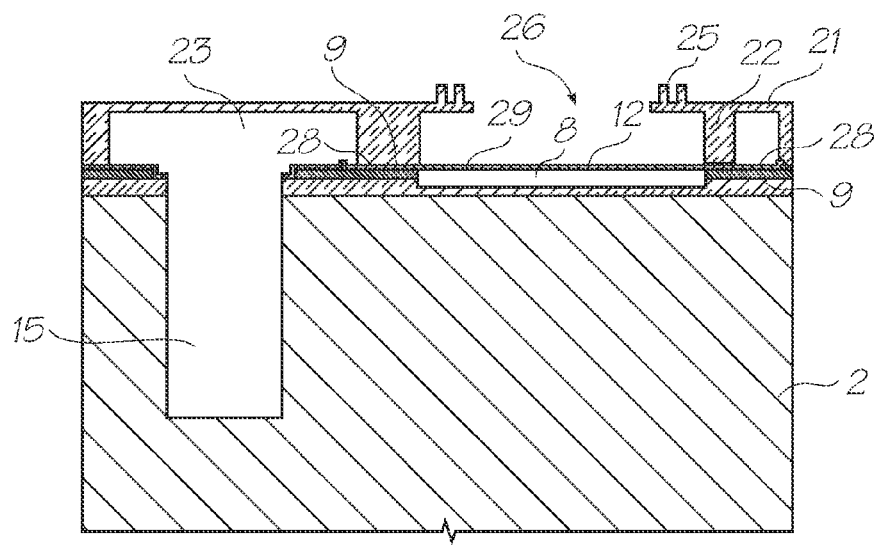
FIG. 34 shows the oxygen plasma release etch of the first and second sacrificial layers.
Figure 35:
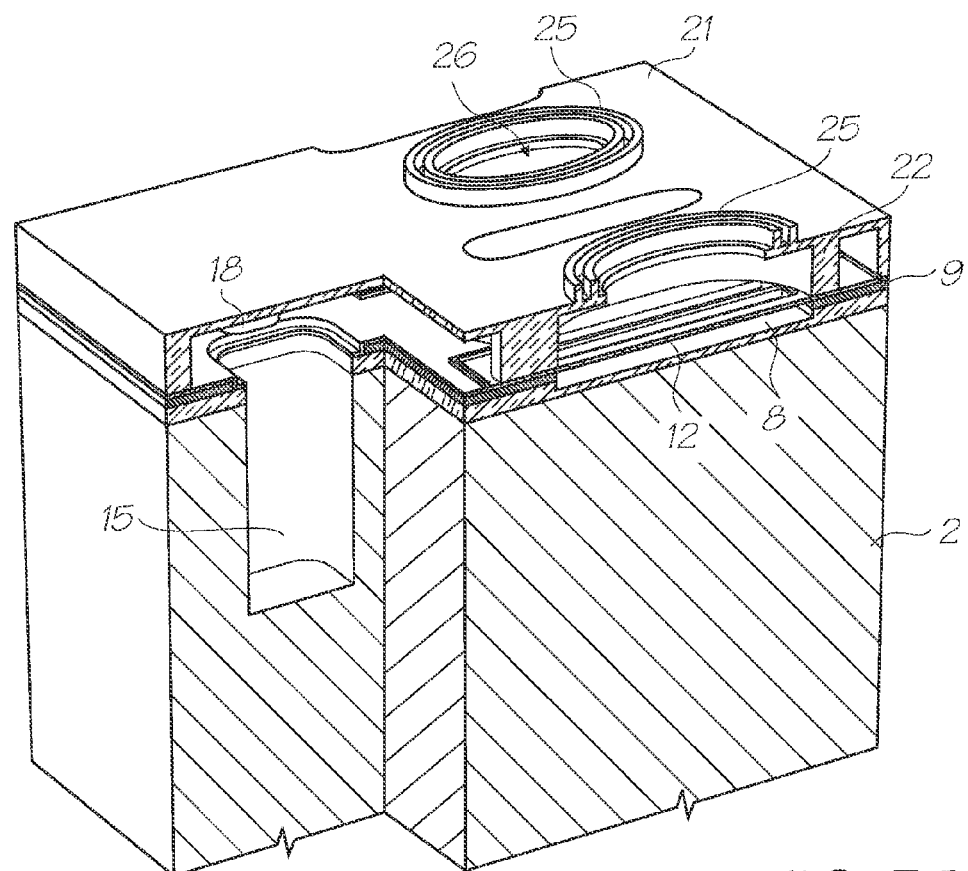
FIG. 35 is a perspective of the unit cell shown in FIG. 34.

With all the MEMS nozzle features now fully formed, the next stage removes the SAC1 and SAC2 photoresist layers 10 and 16 by $O_2$ plasma ashing (FIGS. 34 to 35). After ashing, the thermal actuator 12 is suspended in a single plane over the pit 8. The coplanar deposition of the contacts 28 and the heater element 29 provides an efficient electrical connection with the electrodes 9.

Figure 36:
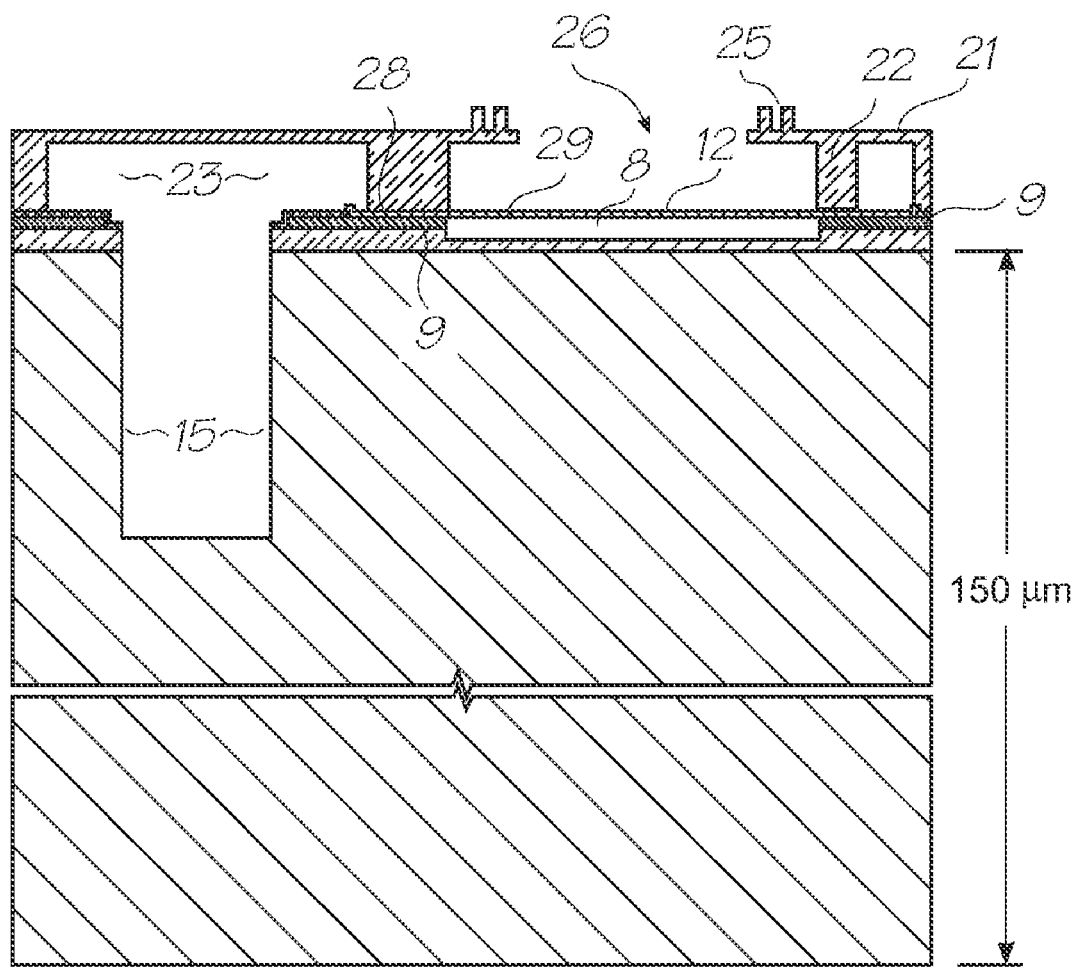
FIG. 36 shows the unit cell after the release etch, as well as the opposing side of the wafer.
Figure 37:
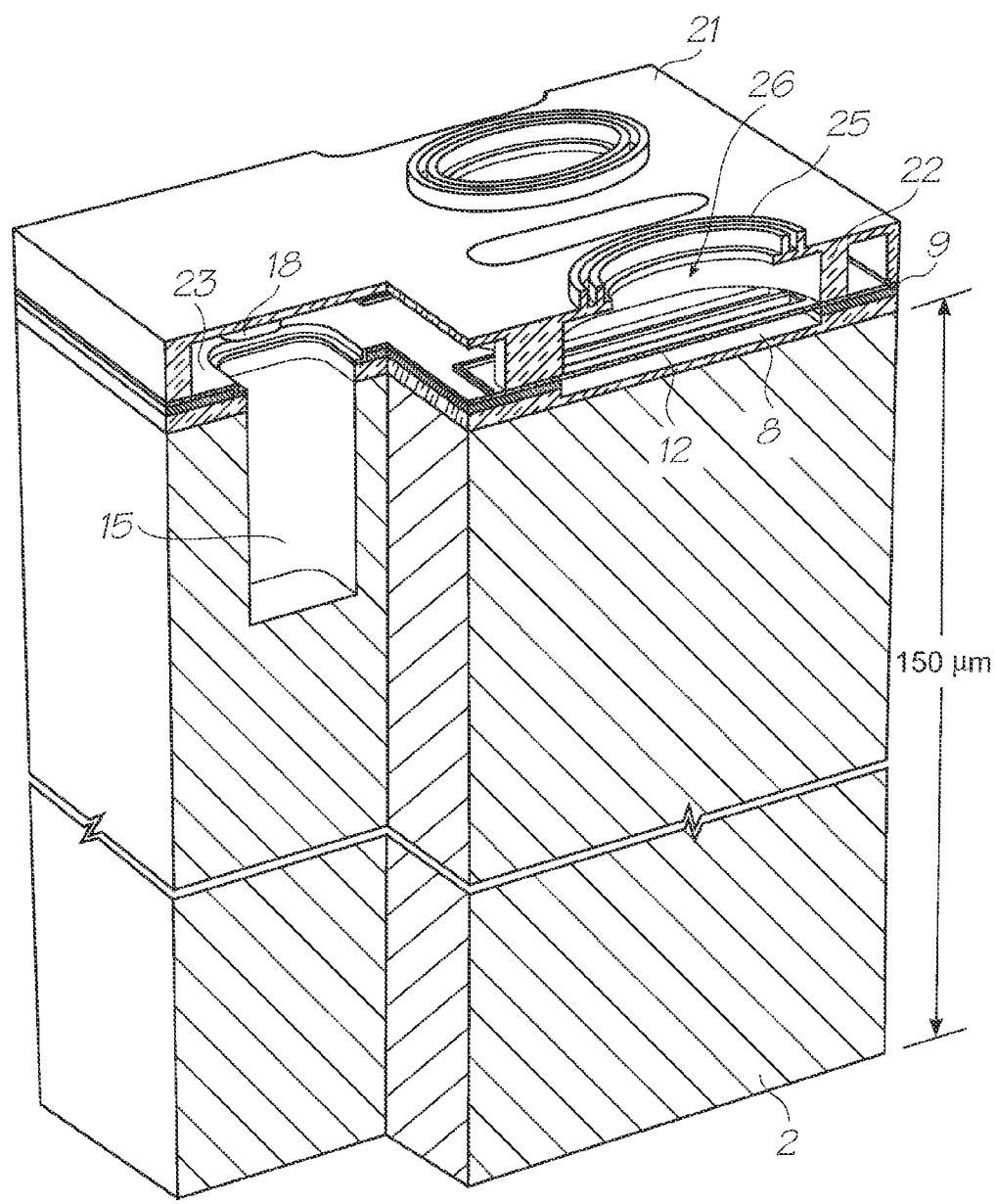
FIG. 37 is a perspective of the unit cell shown in FIG. 36.

FIGS. 36 and 37 show the entire thickness (150 microns) of the silicon wafer 2 after ashing the SAC1 and SAC2 photoresist layers 10 and 16.

Figure 38:
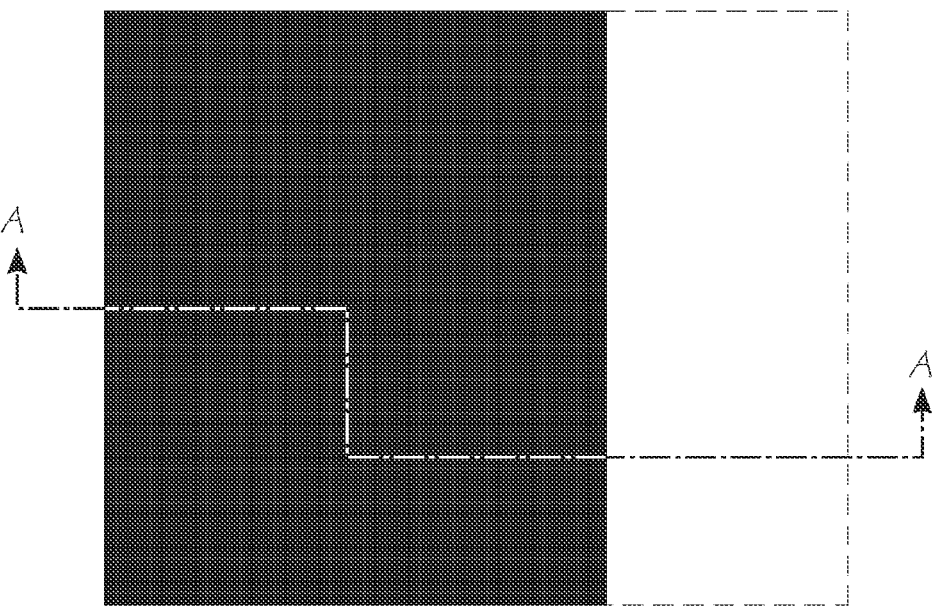
FIG. 38 is the mask associated with the reverse etch shown in FIG. 39.
Figure 39:
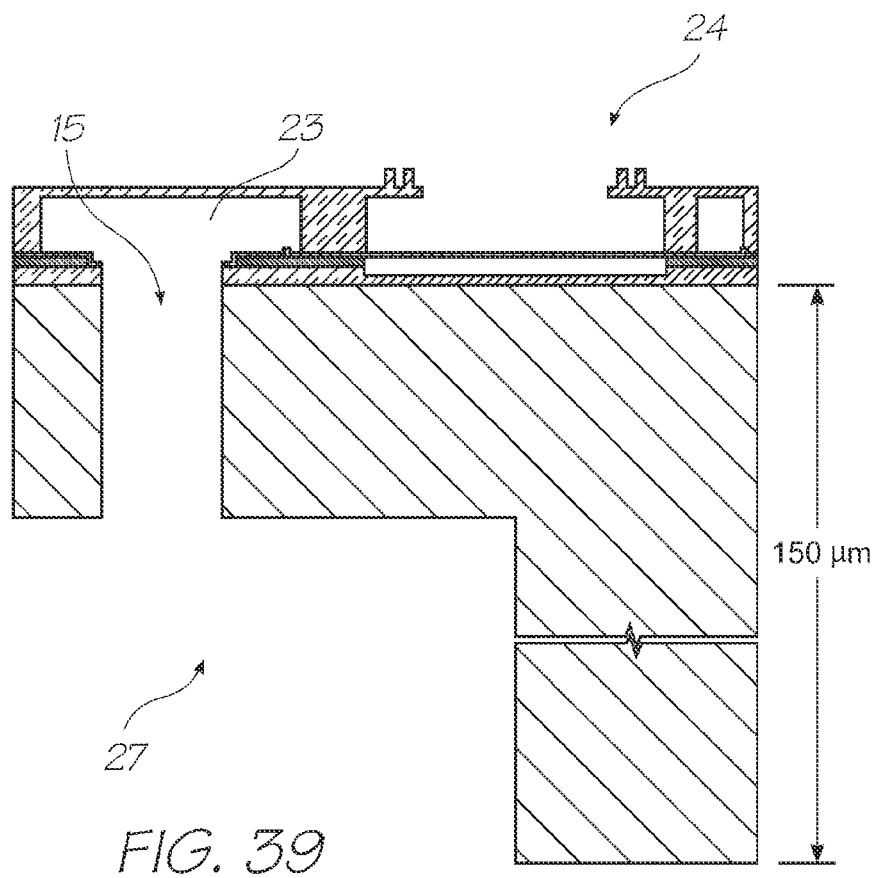
FIG. 39 shows the reverse etch of the ink supply channel into the wafer.
Figure 40:
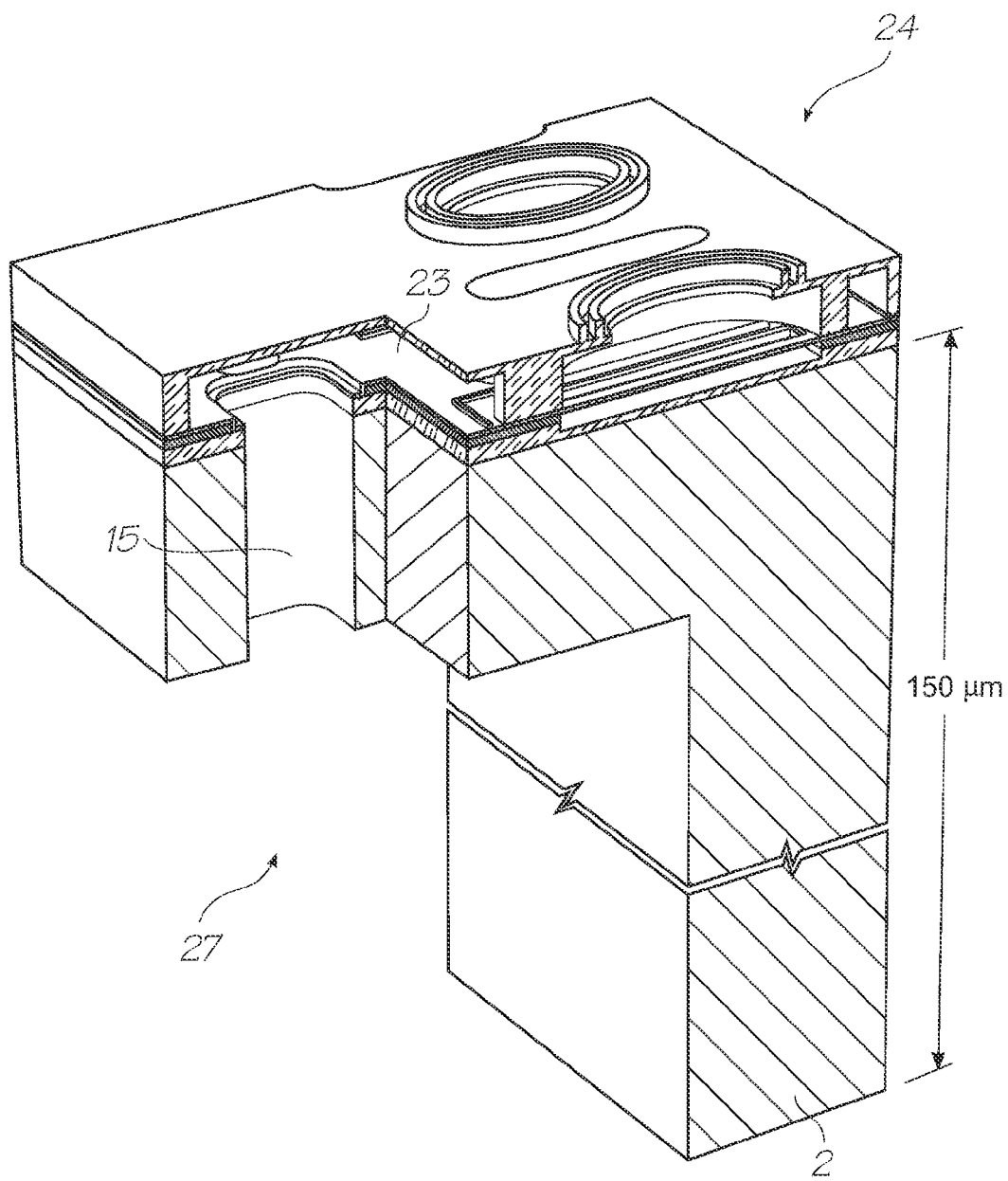
FIG. 40 is a perspective of unit cell shown in FIG. 39.

Referring to FIGS. 38 to 40, once frontside MEMS processing of the wafer is completed, ink supply channels 27 are etched from the backside of the wafer to meet with the ink inlets 15 using a standard anisotropic DRIE. This backside etch is defined using a layer of photoresist (not shown) exposed by the dark tone mask shown in FIG. 38. The ink supply channel 27 makes a fluidic connection between the backside of the wafer and the ink inlets 15.

Figure 41:
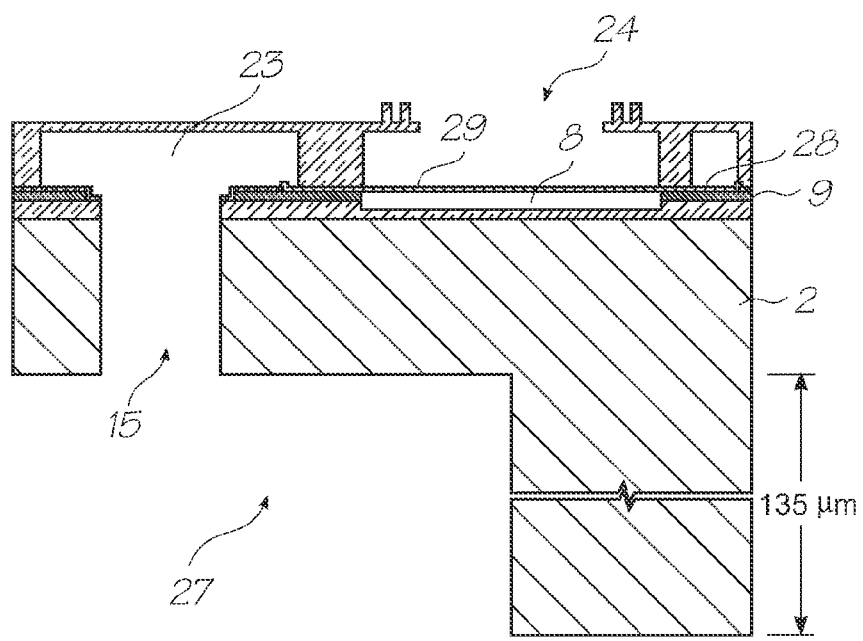
FIG. 41 shows the thinning of the wafer by backside etching.
Figure 42:
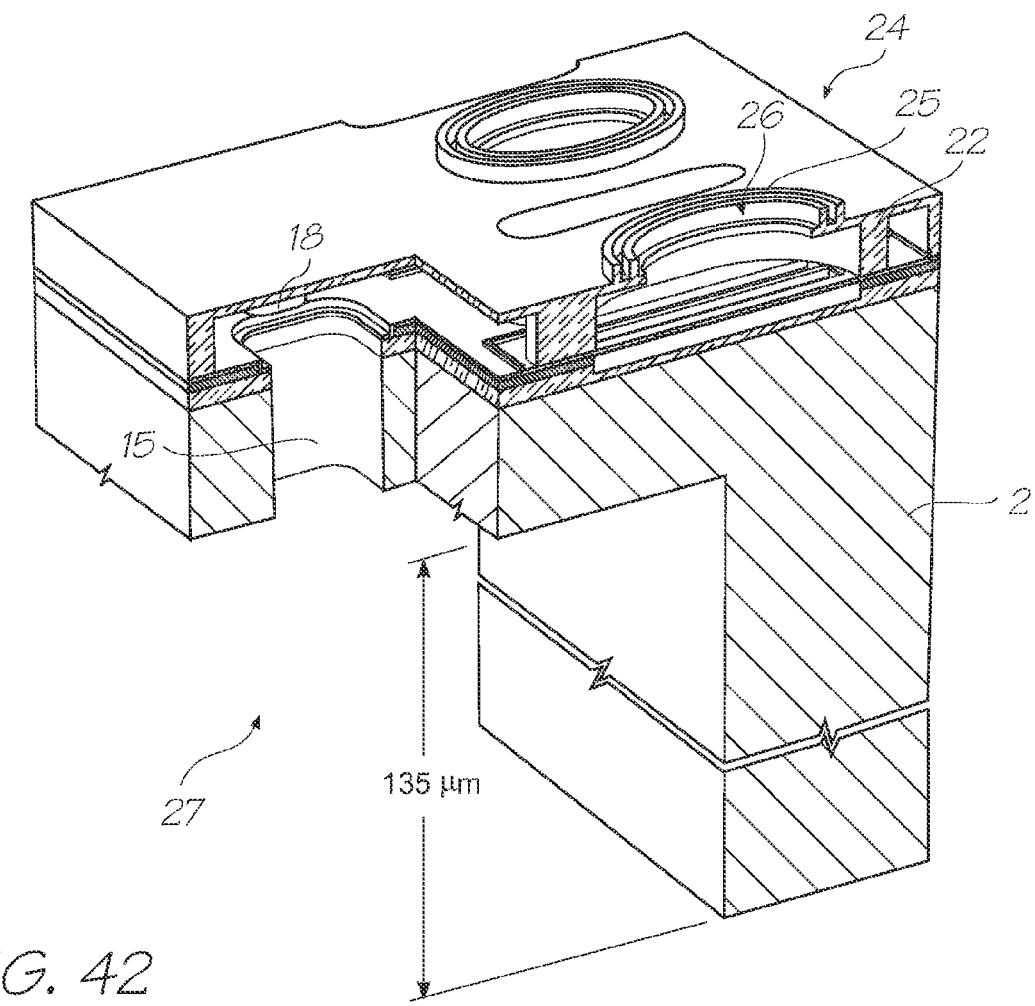
FIG. 42 is a perspective of the unit cell shown in FIG. 41.
Figure 43:
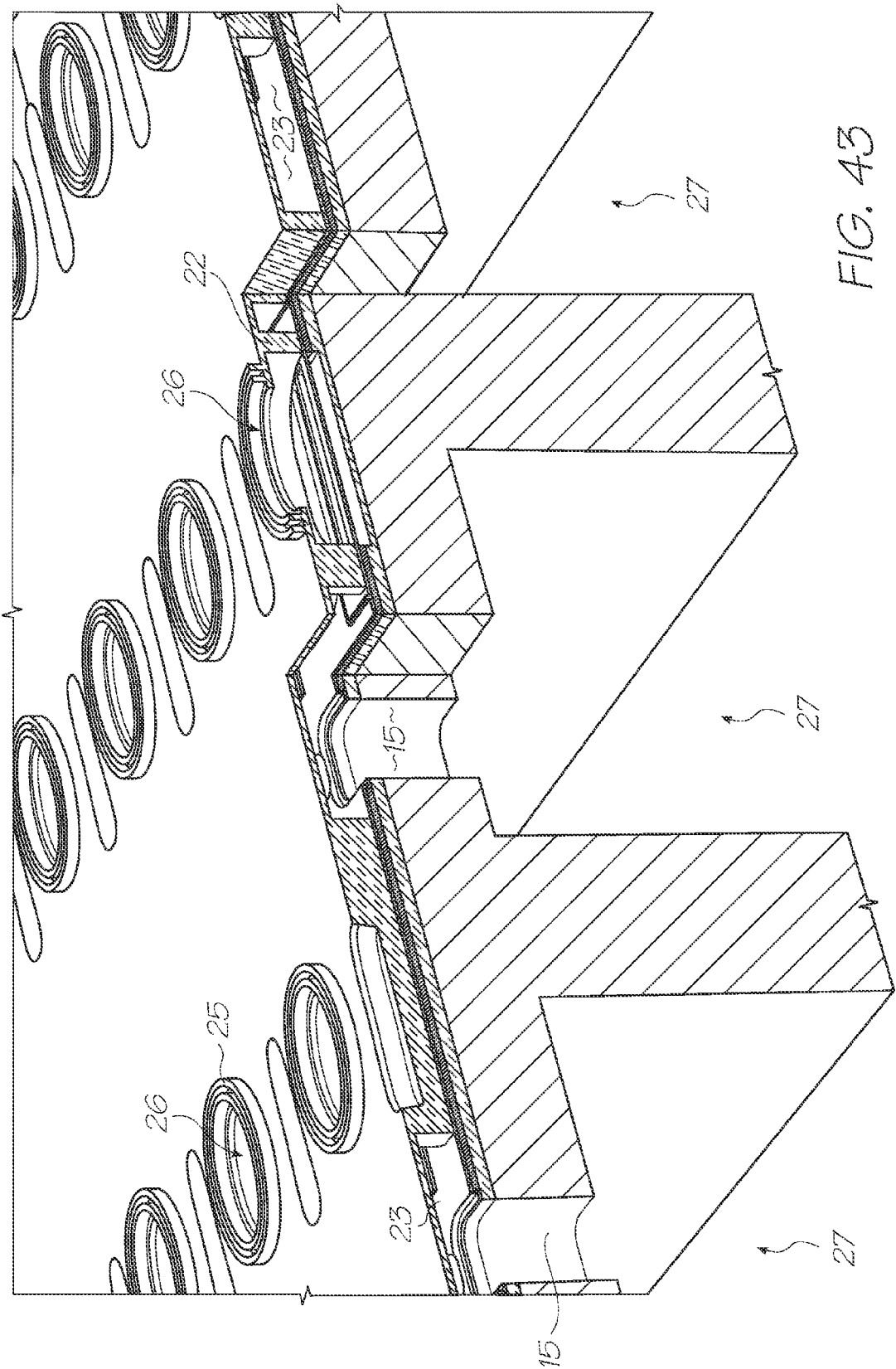
FIG. 43 is a partial perspective of the array of nozzles on the printhead according to the present invention.
Figure 44:
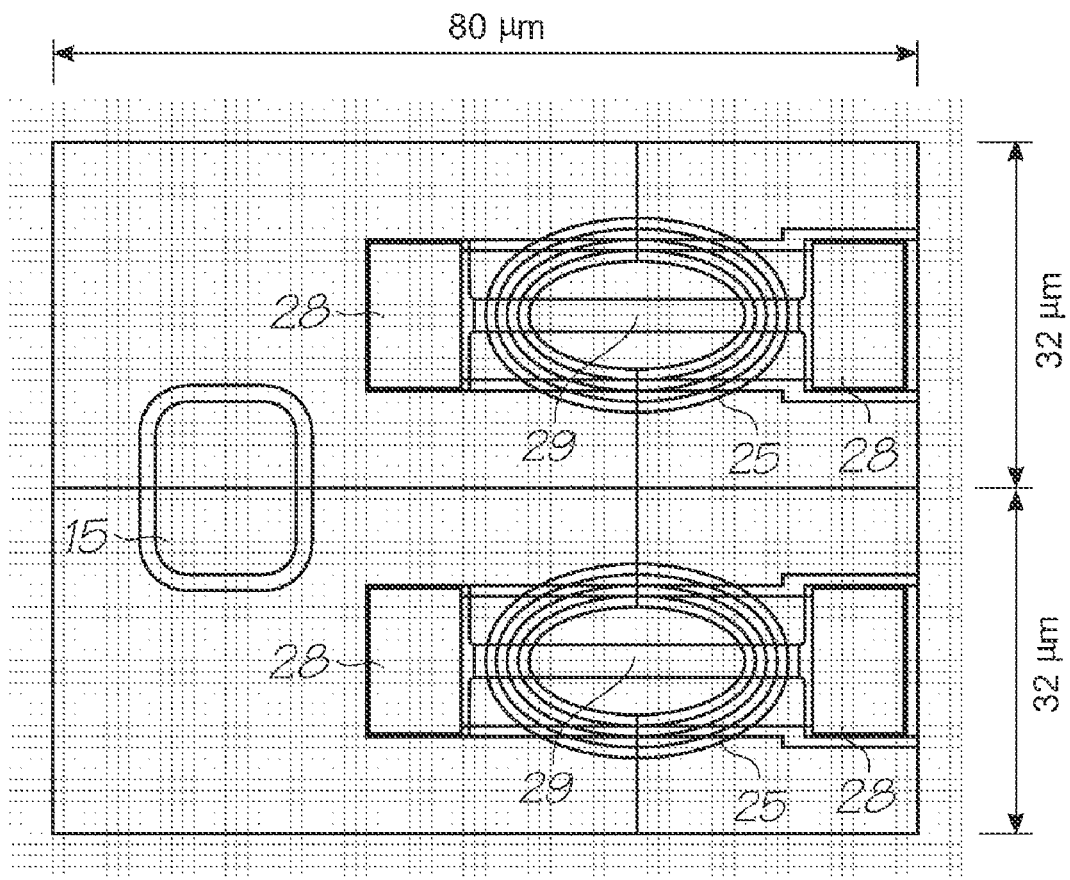
FIG. 44 shows the plan view of a unit cell.
Figure 45:
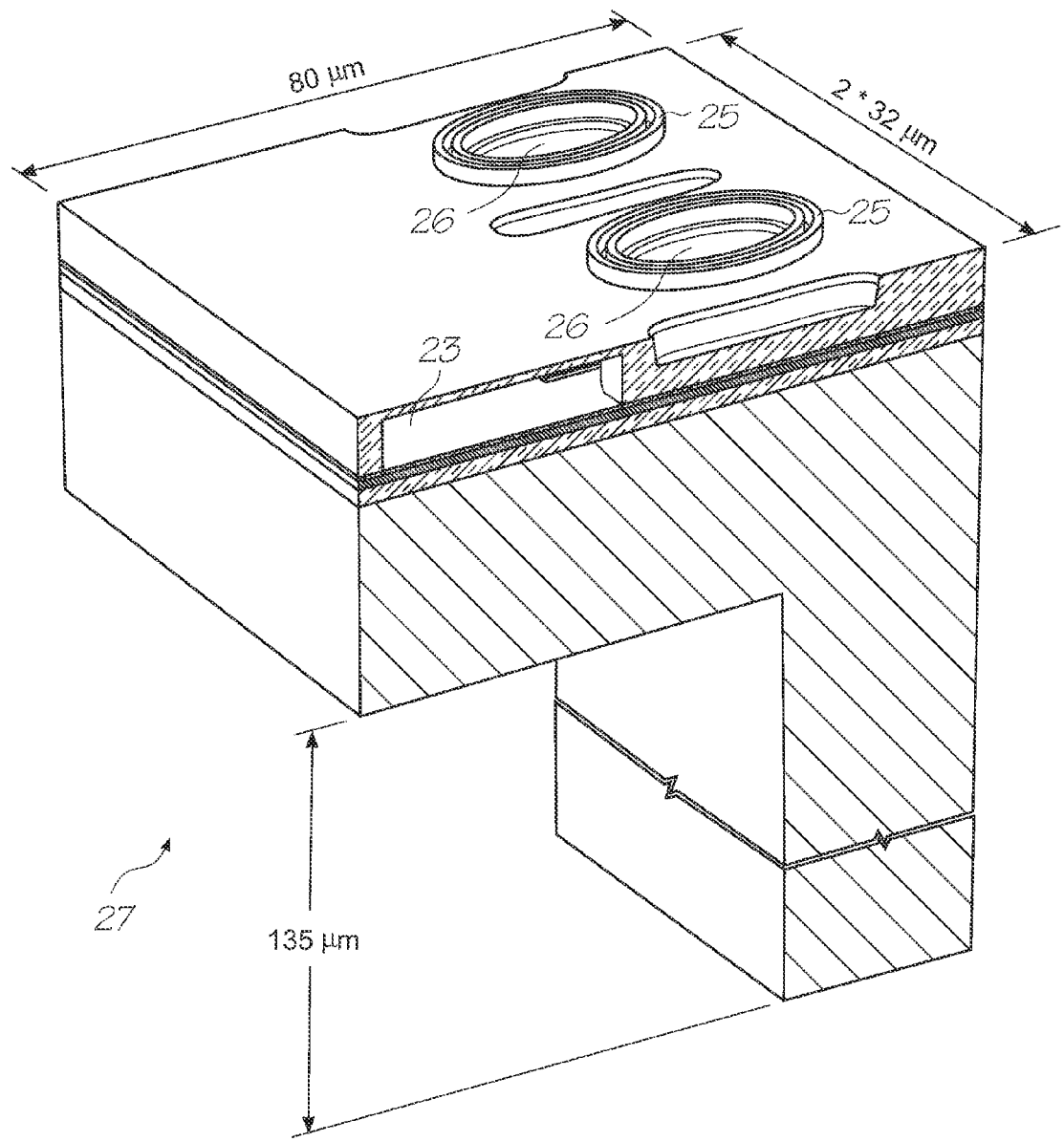
FIG. 45 shows a perspective of the unit cell shown in FIG. 44.

Finally, and referring to FIGS. 41 and 42, the wafer is thinned 135 microns by backside etching. FIG. 43 shows three adjacent rows of nozzles in a cutaway perspective view of a completed printhead integrated circuit. Each row of nozzles has a respective ink supply channel 27 extending along its length and supplying ink to a plurality of ink inlets 15 in each row. The ink inlets, in turn, supply ink to the ink conduit 23 for each row, with each nozzle chamber receiving ink from a common ink conduit for that row.

Features and Advantages of Particular Embodiments

Discussed below, under appropriate sub-headings, are certain specific features of embodiments of the invention, and the advantages of these features. The features are to be considered in relation to all of the drawings pertaining to the present invention unless the context specifically excludes certain drawings, and relates to those drawings specifically referred to.

Low Loss Electrodes

As shown in FIGS. 41 and 42, the heater element 29 is suspended within the chamber. This ensures that the heater element is immersed in ink when the chamber is primed. Completely immersing the heater element in ink dramatically improves the printhead efficiency. Much less heat dissipates into the underlying wafer substrate so more of the input energy is used to generate the bubble that ejects the ink.

To suspend the heater element, the contacts may be used to support the element at its raised position. Essentially, the contacts at either end of the heater element can have vertical or inclined sections to connect the respective electrodes on the CMOS drive to the element at an elevated position. However, heater material deposited on vertical or inclined surfaces is thinner than on horizontal surfaces. To avoid undesirable resistive losses from the thinner sections, the contact portion of the thermal actuator needs to be relatively large. Larger contacts occupy a significant area of the wafer surface and limit the nozzle packing density.

To immerse the heater, the present invention etches a pit or trench 8 between the electrodes 9 to drop the level of the chamber floor. As discussed above, a layer of sacrificial photoresist (SAC) 10 (see FIG. 9) is deposited in the trench to provide a scaffold for the heater element. However, depositing SAC 10 in the trench 8 and simply covering it with a layer of heater material, can lead to stringers forming in the gaps 46 between the SAC 10 and the sidewalls 48 of the trench 8 (as previously described in relation to FIG. 7). The gaps form because it is difficult to precisely match the mask with the sides of the trench 8. Usually, when the masked photoresist is exposed, the gaps 46 form between the sides of the pit and the SAC. When the heater material layer is deposited, it fills these gaps to form 'stringers' (as they are known). The stringers remain in the trench 8 after the metal etch (that shapes the heater element) and the release etch (to finally remove the SAC). The stringers can short circuit the heater so that it fails to generate a bubble.

Figure 52:
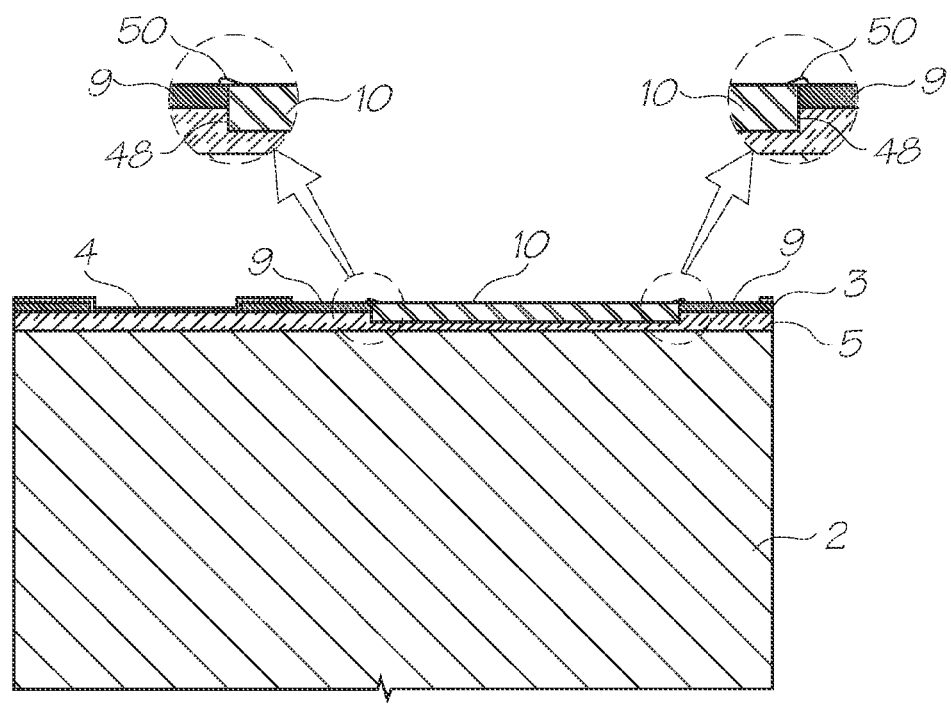
FIG. 52 is a partial section view showing the deposition of SAC1 photoresist in accordance with prior art techniques used to avoid stringers.
Figure 53:
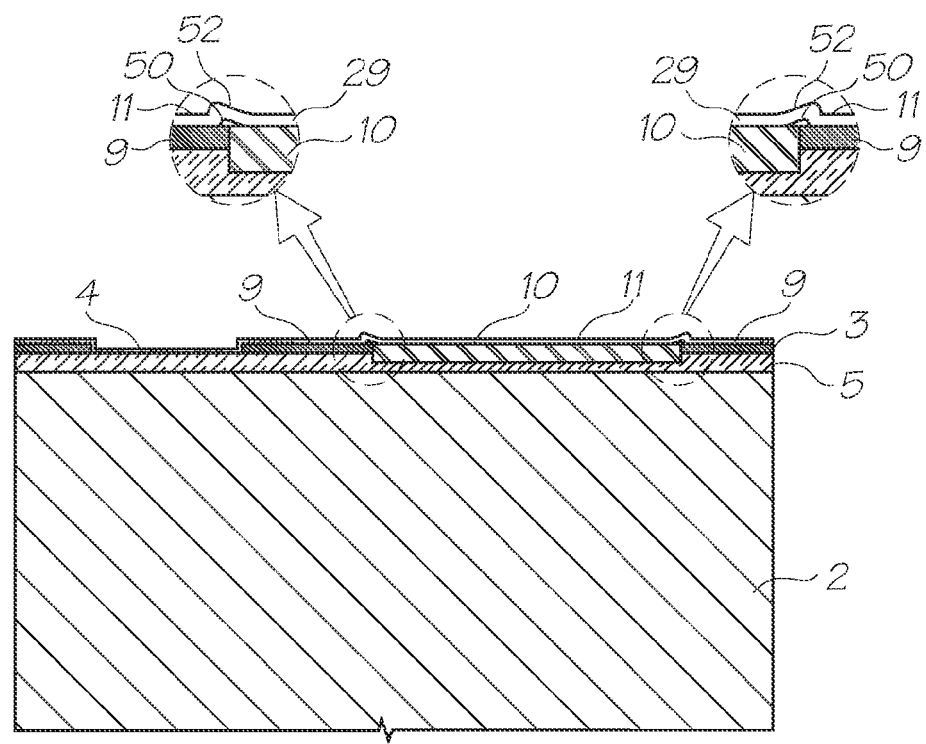
FIG. 53 is a partial section view showing the depositon of a layer of heater material onto the SAC1 photoresist scaffold deposited in FIG. 52; and, FIG. 54 is a partial schematic plan view of a unit cell with multiple nozzles and actuators in each of the chambers.

Turning now to FIGS. 52 and 53, the 'traditional' technique for avoiding stringers is illustrated. By making the UV mask that exposes the SAC slightly bigger than the trench 8, the SAC 10 will be deposited over the side walls 48 so that no gaps form. Unfortunately, this produces a raised lip 50 around top of the trench. When the heater material layer 11 is deposited (see FIG. 53), it is thinner on the vertical or inclined surfaces 52 of the lip 50. After the metal etch and release etch, these thin lip formations 52 remain and cause 'hotspots' because the localized thinning increases resistance. These hotspots affect the operation of the heater and typically reduce heater life.

As discussed above, the Applicant has found that reflowing the SAC 10 closes the gaps 46 so that the scaffold between the electrodes 9 is completely flat. This allows the entire thermal actuator 12 to be planar. The planar structure of the thermal actuator, with contacts directly deposited onto the CMOS electrodes 9 and suspended heater element 29, avoids hotspots caused by vertical or inclined surfaces so that the contacts can be much smaller structures without acceptable increases in resistive losses. Low resistive losses preserves the efficient operation of a suspended heater element and the small contact size is convenient for close nozzle packing on the printhead.

Multiple Nozzles for Each Chamber

Figure 49:
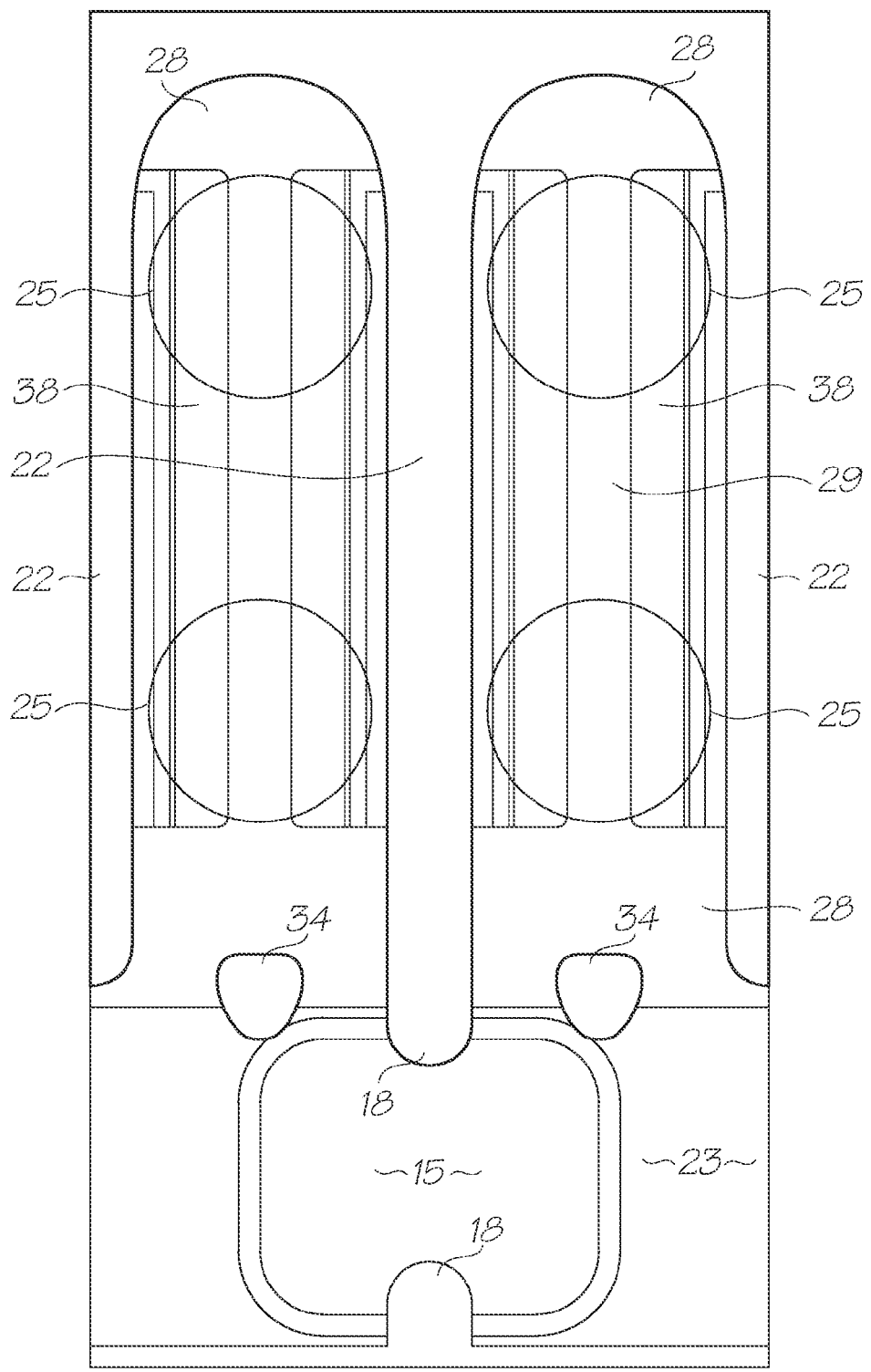
FIG. 49 is schematic plan view of a unit cells with the roof layer removed but the nozzle openings shown in outline only.

Referring to FIG. 49, the unit cell shown has two separate ink chambers 38, each chamber having heater element 29 extending between respective pairs of contacts 28. Ink permeable structures 34 are positioned in the ink refill openings so that ink can enter the chambers, but upon actuation, the structures 34 provide enough hydraulic resistance to reduce any reverse flow or fluidic cross talk to an acceptable level.

Ink is fed from the reverse side of the wafer through the ink inlet 15. Priming features 18 extend into the inlet opening so that an ink meniscus does not pin itself to the peripheral edge of the opening and stop the ink flow. Ink from the inlet 15 fills the lateral ink conduit 23 which supplies both chambers 38 of the unit cell.

Instead of a single nozzle per chamber, each chamber 38 has two nozzles 25. When the heater element 29 actuates (forms a bubble), two drops of ink are ejected; one from each nozzle 25. Each individual drop of ink has less volume than the single drop ejected if the chamber had only one nozzle. By ejecting multiple drops from a single chamber simultaneously improves the print quality.

With every nozzle, there is a degree of misdirection in the ejected drop. Depending on the degree of misdirection, this can be detrimental to print quality. By giving the chamber multiple nozzles, each nozzle ejects drops of smaller volume, and having different misdirections. Several small drops misdirected in different directions are less detrimental to print quality than a single relatively large misdirected drop. The Applicant has found that the eye averages the misdirections of each small drop and effectively 'sees' a dot from a single drop with a significantly less overall misdirection.

A multi nozzle chamber can also eject drops more efficiently than a single nozzle chamber. The heater element 29 is an elongate suspended beam of TiAlN and the bubble it forms is likewise elongated. The pressure pulse created by an elongate bubble will cause ink to eject through a centrally disposed nozzle. However, some of the energy from the pressure pulse is dissipated in hydraulic losses associated with the mismatch between the geometry of the bubble and that of the nozzle.

Spacing several nozzles 25 along the length of the heater element 29 reduces the geometric discrepancy between the bubble shape and the nozzle configuration through which the ink ejects.

This in turn reduces hydraulic resistance to ink ejection and thereby improves printhead efficiency.

Ink Chamber Re-Filled Via Adjacent Ink Chamber

Figure 46:
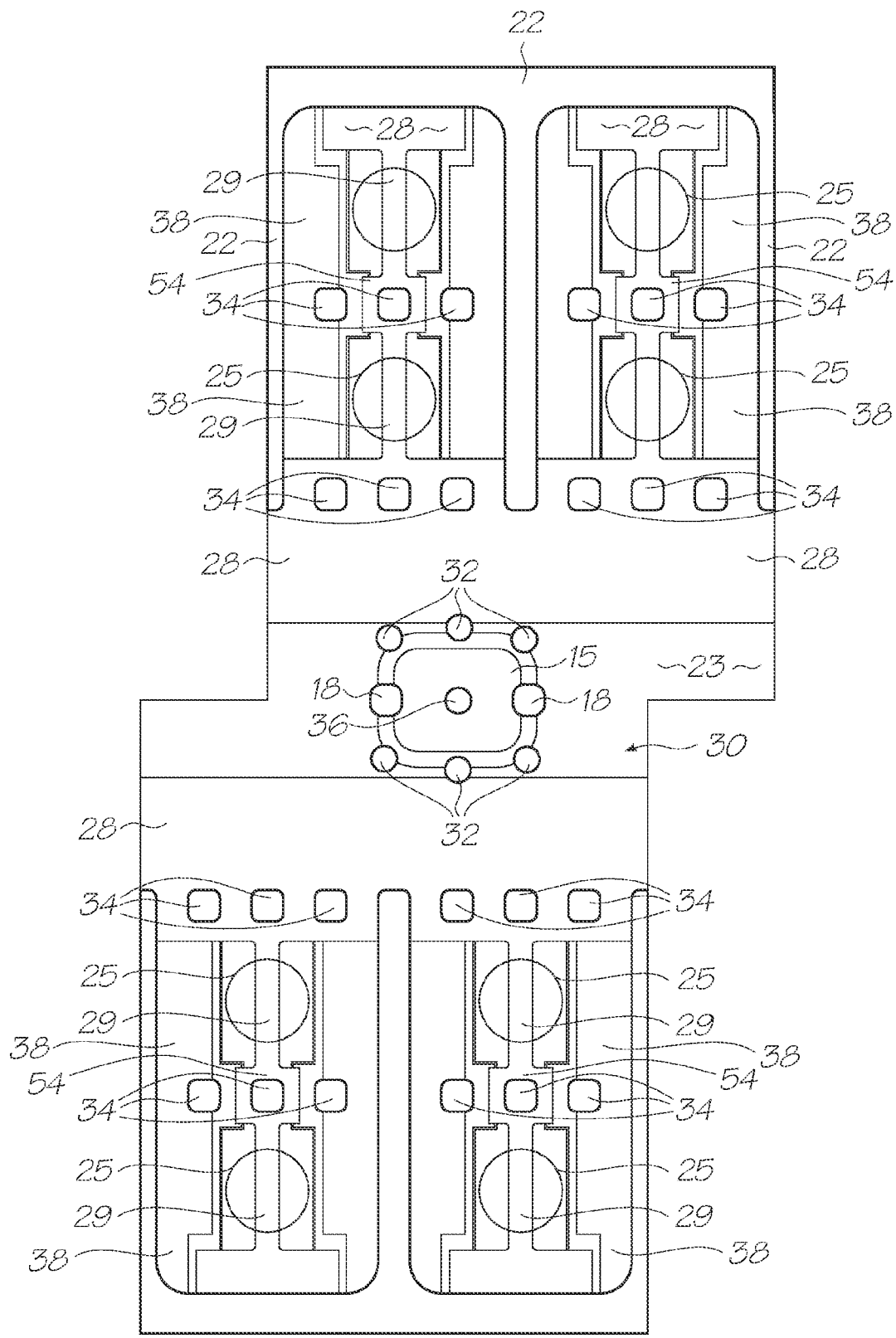
FIG. 46 is schematic plan view of two unit cells with the roof layer removed but certain roof layer features shown in outline only.

Referring to FIG. 46, two opposing unit cells are shown. In this embodiment, unit cell has four ink chambers 38. The chambers are defined by the sidewalls 22 and the ink permeable structures 34. Each chamber has its own heater element 29. The heater elements 29 are arranged in pairs that are connected in series. Between each pair is 'cold spot' 54 with lower resistance and or greater heat sinking. This ensures that bubbles do not nucleate at the cold spots 54 and thus the cold spots become the common contact between the outer contacts 28 for each heater element pair.

The ink permeable structures 34 allow ink to refill the chambers 38 after drop ejection but baffle the pressure pulse from each heater element 29 to reduce the fluidic cross talk between adjacent chambers. It will be appreciated that this embodiment has many parallels with that shown in FIG. 49 discussed above. However, the present embodiment effectively divides the relatively long chambers of FIG. 49 into two separate chambers. This further aligns the geometry of the bubble formed by the heater element 29 with the shape of the nozzle 25 to reduce hydraulic losses during drop ejection. This is achieved without reducing the nozzle density but it does add some complexity to the fabrication process.

The conduits (ink inlets 15 and supply conduits 23) for distributing ink to every ink chamber in the array can occupy a significant proportion of the wafer area. This can be a limiting factor for nozzle density on the printhead. By making some ink chambers part of the ink flow path to other ink chambers, while keeping each chamber sufficiently free of fluidic cross talk, reduces the amount of wafer area lost to ink supply conduits.

Ink Chamber with Multiple Actuators and Respective Nozzles

Figure 54:
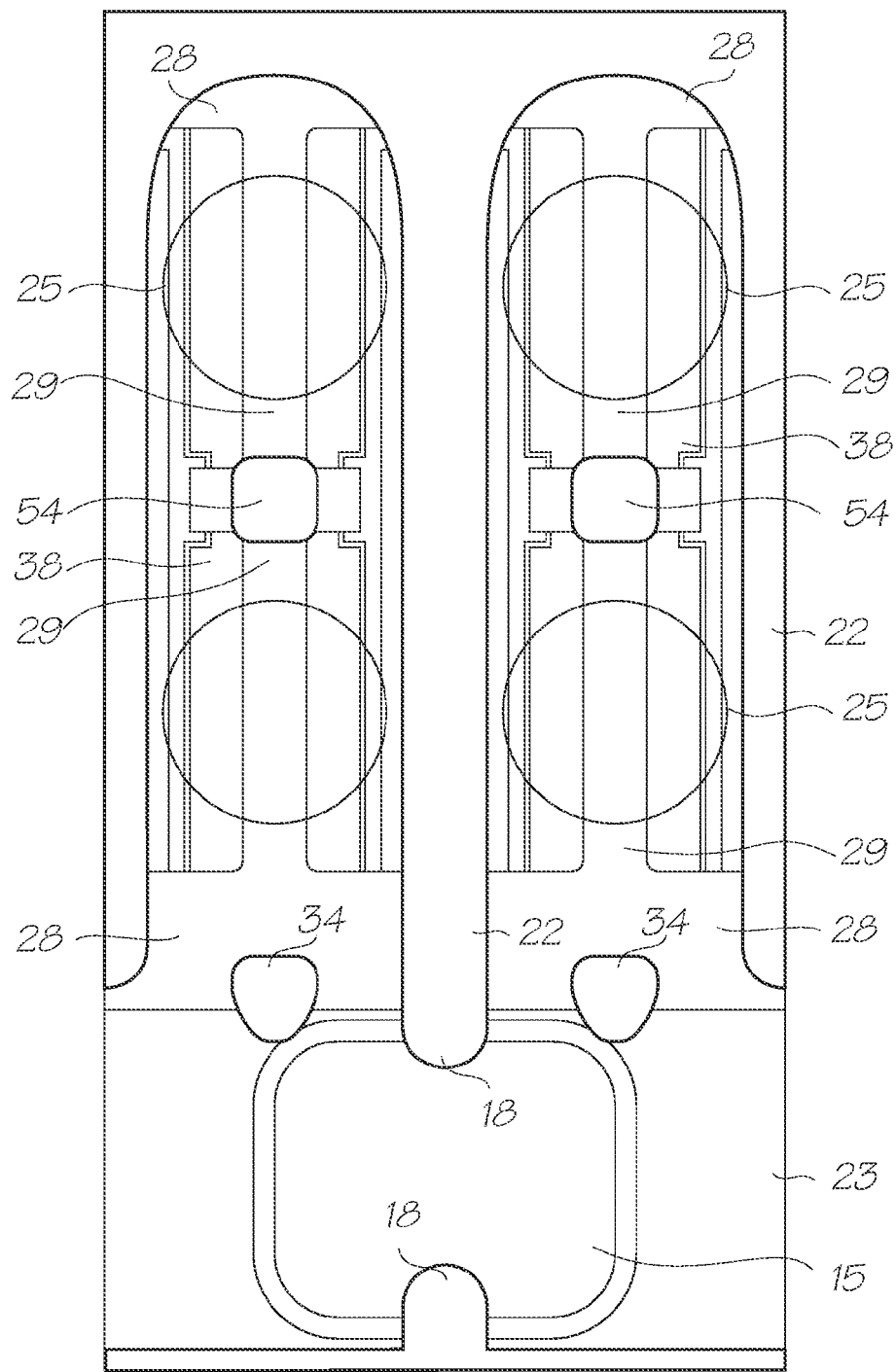

Referring to FIG. 54, the unit cell shown has two chambers 38; each chamber has two heater elements 29 and two nozzles 25. The effective reduction in drop misdirection by using multiple nozzles per chamber is discussed above in relation to the embodiment shown in FIG. 49. The additional benefits of dividing a single elongate chamber into separate chambers, each with their own actuators, is described above with reference to the embodiment shown in FIG. 46. The present embodiment uses multiple nozzles and multiple actuators in each chamber to achieve much of the advantages of the FIG. 46 embodiment with a markedly less complicated design. With a simplified design, the overall dimensions of the unit cell are reduced thereby permitting greater nozzle densities. In the embodiment shown, the footprint of the unit cell is 64 µm long by 16 µm wide.

The ink permeable structure 34 is a single column at the ink refill opening to each chamber 38 instead of three spaced columns as with the FIG. 46 embodiment. The single column has a cross section profiled to be less resistive to refill flow, but more resistive to sudden back flow from the actuation pressure pulse. Both heater elements in each chamber can be deposited simultaneously, together with the contacts 28 and the cold spot feature 54. Both chambers 38 are supplied with ink from a common ink inlet 15 and supply conduit 23. These features also allow the footprint to be reduced and they are discussed in more detail below. The priming features 18 have been made integral with one of the chamber sidewalls 22 and a wall ink conduit 23. The dual purpose nature of these features simplifies the fabrication and helps to keep the design compact.

Multiple Chambers and Multiple Nozzles for Each Drive Circuit

In FIG. 54, the actuators are connected in series and therefore fire in unison from the same drive signal to simplify the CMOS drive circuitry. In the FIG. 46 unit cell, actuators in adjacent nozzles are connected in series within the same drive circuit. Of course, the actuators in adjacent chambers could also be connected in parallel. In contrast, were the actuators in each chamber to be in separate circuits, the CMOS drive circuitry would be more complex and the dimensions of the unit cell footprint would increase. In printhead designs where the drop misdirection is addressed by substituting multiple smaller drops, combining several actuators and their respective nozzles into a common drive circuit is an efficient implementation both in terms of printhead IC fabrication and nozzles density.

High Density Thermal Inkjet Printhead

Reduction in the unit cell width enables the printhead to have nozzles patterns that previously would have required the nozzle density to be reduced. Of course, a lower nozzle density has a corresponding influence on printhead size and/or print quality.

Traditionally, the nozzle rows are arranged in pairs with the actuators for each row extending in opposite directions. The rows are staggered with respect to each other so that the printing resolution (dots per inch) is twice the nozzle pitch (nozzles per inch) along each row. By configuring the components of the unit cell such that the overall width of the unit is reduced, the same number of nozzles can be arranged into a single row instead of two staggered and opposing rows without sacrificing any print resolution (d.p.i.). The embodiments shown in the accompanying figures achieve a nozzle pitch of more than 1000 nozzles per inch in each linear row. At this nozzle pitch, the print resolution of the printhead is better than photographic (1600 dpi) when two opposing staggered rows are considered, and there is sufficient capacity for nozzle redundancy, dead nozzle compensation and so on which ensures the operation life of the printhead remains satisfactory. As discussed above, the embodiment shown in FIG. 54 has a footprint that is 16 µm wide and therefore the nozzle pitch along one row is about 1600 nozzles per inch. Accordingly, two offset staggered rows yield a resolution of about 3200 d.p.i.

With the realisation of the particular benefits associated with a narrower unit cell, the Applicant has focussed on identifying and combining a number of features to reduce the relevant dimensions of structures in the printhead. For example, elliptical nozzles, shifting the ink inlet from the chamber, finer geometry logic and shorter drive FETs (field effect transistors) are features developed by the Applicant to derive some of the embodiments shown. Each contributing feature necessitated a departure from conventional wisdom in the field, such as reducing the FET drive voltage from the widely used traditional 5V to 2.5V in order to decrease transistor length.

Reduced Stiction Printhead Surface

Figure 50:
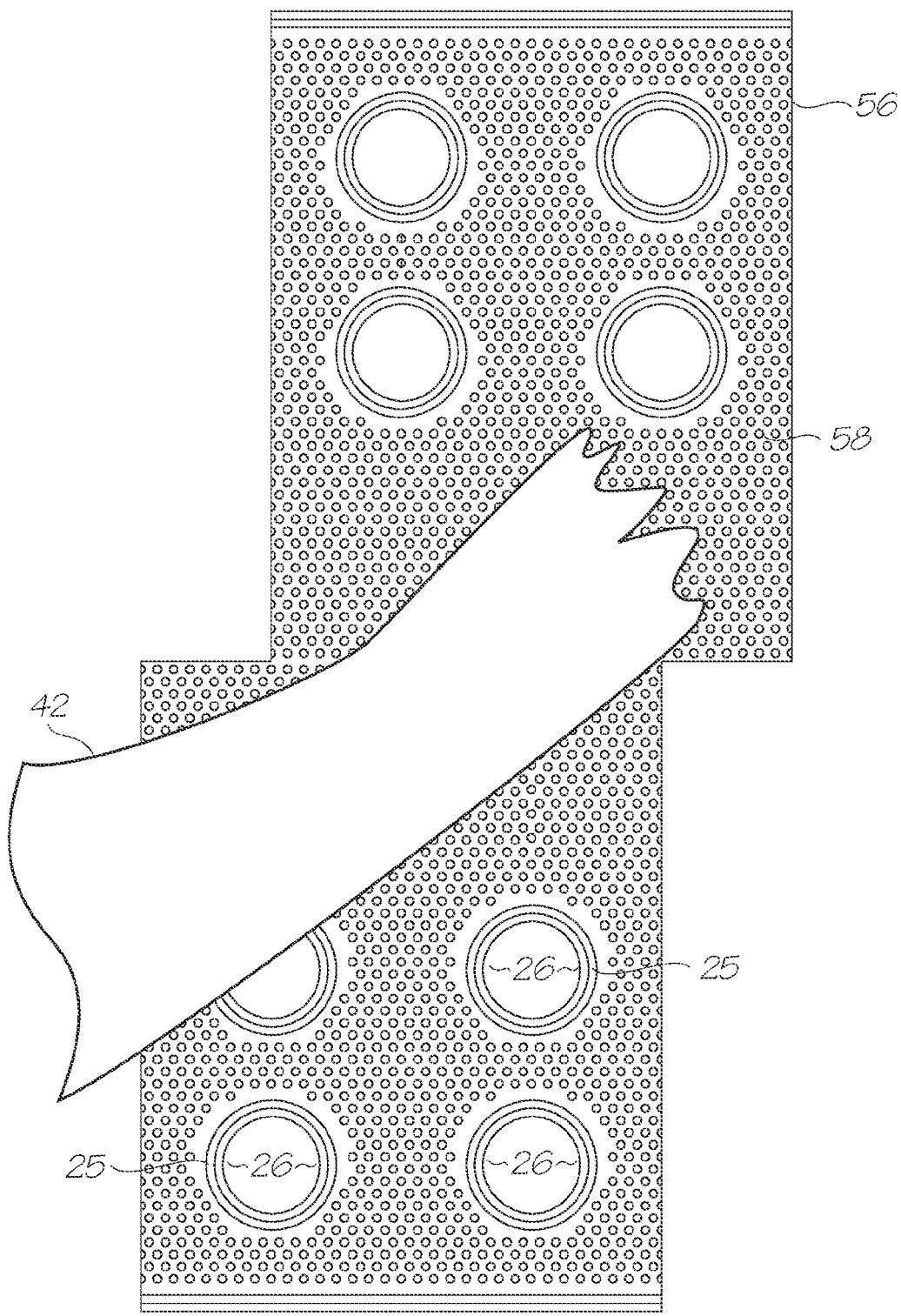
FIG. 50 is a partial plan view of the nozzle plate with stiction reducing formations and a particle of paper dust.

Static friction, or "stiction" as it has become known, allows dust particles to "stick" to nozzle plates and thereby clog nozzles. FIG. 50 shows a portion of the nozzle plate 56. For clarity, the nozzle apertures 26 and the nozzle rims 25 are also shown. The exterior surface of the nozzle plate is patterned with columnar projections 58 extending a short distance from the plate surface. The nozzle plate could also be patterned with other surface formations such as closely spaced ridges, corrugations or bumps. However, it is easy to create a suitable UV mask for the pattern columnar projections shown, and it is a simple matter to etch the columns into the exterior surface.

By reducing the co-efficient of static friction, there is less likelihood that paper dust or other contaminants will clog the nozzles in the nozzle plate. Patterning the exterior of the nozzle plate with raised formations limits the surface area that dust particles contact. If the particles can only contact the outer extremities of each formation, the friction between the particles and the nozzle plate is minimal so attachment is much less likely. If the particles do attach, they are more likely to be removed by printhead maintenance cycles.

Inlet Priming Feature

Figure 47:
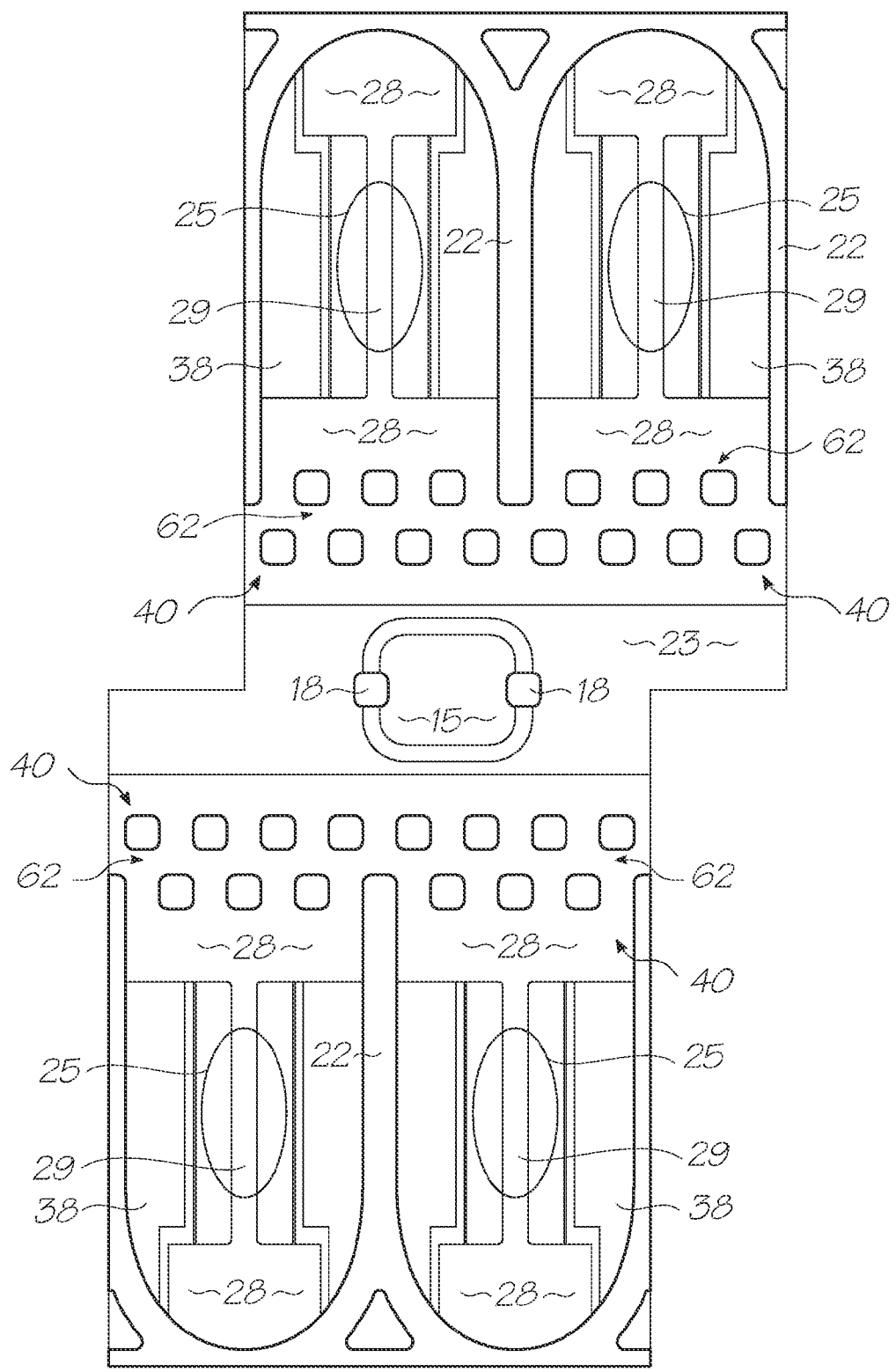
FIG. 47 is schematic plan view of two unit cells with the roof layer removed but the nozzle openings shown in outline only.

Referring to FIG. 47, two unit cells are shown extending in opposite directions to each other. The ink inlet passage 15 supplies ink to the four chambers 38 via the lateral ink conduit 23. Distributing ink through micron-scale conduits, such as the ink inlet 15, to individual MEMS nozzles in an inkjet printhead is complicated by factors that do not arise in macro-scale flow. A meniscus can form and, depending on the geometry of the aperture, it can 'pin' itself to the lip of the aperture quite strongly. This can be useful in printheads, such as bleed holes that vent trapped air bubbles but retain the ink, but it can also be problematic if stops ink flow to some chambers. This will most likely occur when initially priming the printhead with ink. If the ink meniscus pins at the ink inlet opening, the chambers supplied by that inlet will stay unprimed. To guard against this, two priming features 18 are formed so that they extend through the plane of the inlet aperture 15. The priming features 18 are columns extending from the interior of the nozzle plate (not shown) to the periphery of the inlet 15. A part of each column 18 is within the periphery so that the surface tension of an ink meniscus at the ink inlet will form at the priming features 18 so as to draw the ink out of the inlet. This 'unpins' the meniscus from that section of the periphery and the flow toward the ink chambers.

The priming features 18 can take many forms, as long as they present a surface that extends transverse to the plane of the aperture. Furthermore, the priming feature can be an integral part of other nozzles features as shown in FIG. 54.

Side Entry Ink Chamber

Figure 48:
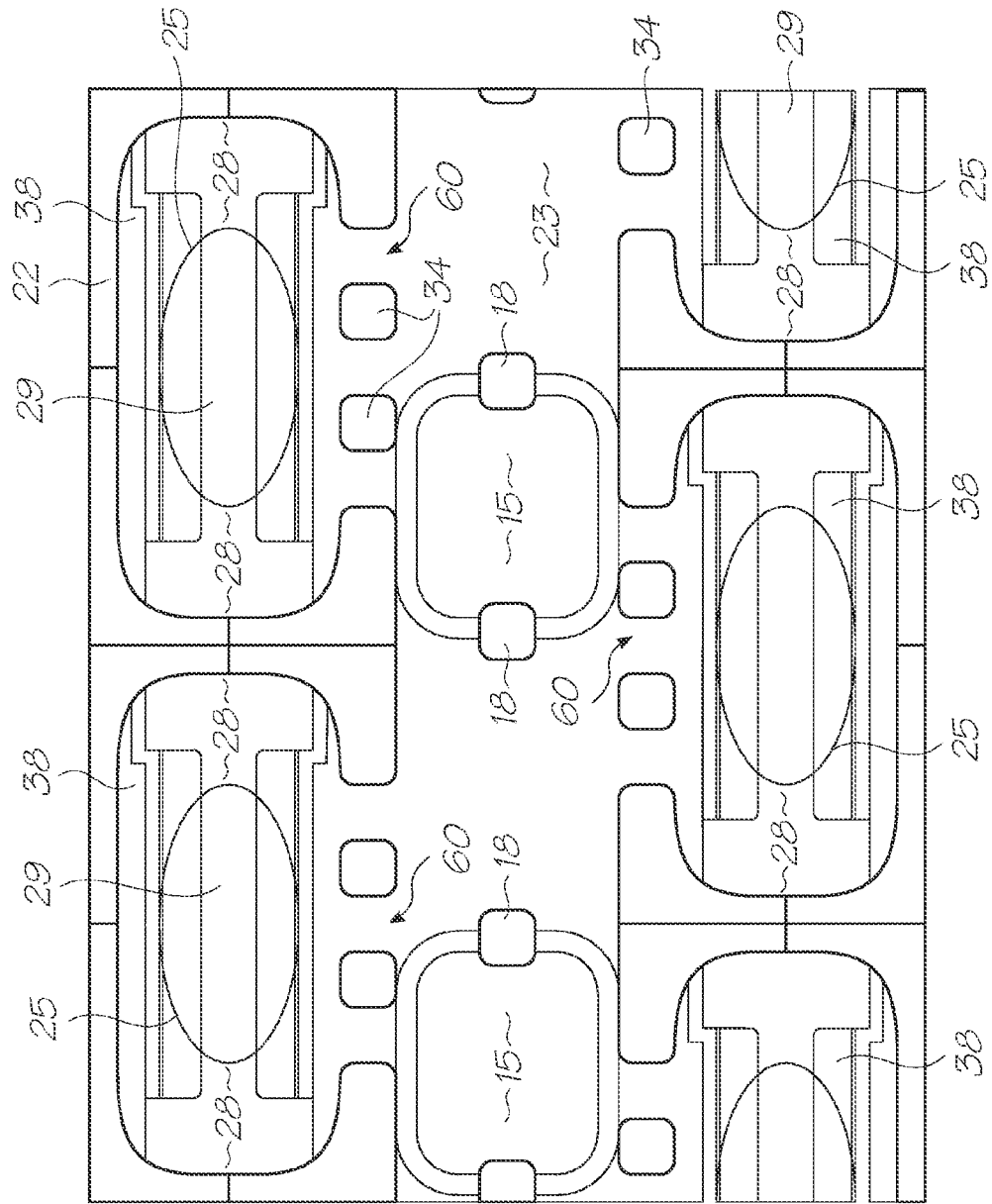
FIG. 48 is a partial schematic plan view of unit cells with ink inlet apertures in the sidewall of the chambers.

Referring to FIG. 48, several adjacent unit cells are shown. In this embodiment, the elongate heater elements 29 extend parallel to the ink distribution conduit 23. Accordingly, the elongate ink chambers 38 are likewise aligned with the ink conduit 23. Sidewall openings 60 connect the chambers 38 to the ink conduit 23. Configuring the ink chambers so that they have side inlets reduces the ink refill times. The inlets are wider and therefore refill flow rates are higher. The sidewall openings 60 have ink permeable structures 34 to keep fluidic cross talk to an acceptable level.

Inlet Filter for Ink Chamber

Referring again to FIG. 47, the ink refill opening to each chamber 38 has a filter structure 40 to trap air bubbles or other contaminants. Air bubbles and solid contaminants in ink are detrimental to the MEMS nozzle structures. The solid contaminants can obvious clog the nozzle openings, while air bubbles, being highly compressible, can absorb the pressure pulse from the actuator if they get trapped in the ink chamber. This effectively disables the ejection of ink from the affected nozzle. By providing a filter structure 40 in the form of rows of obstructions extending transverse to the flow direction through the opening, each row being spaced such that they are out of registration with the obstructions in an adjacent row with respect to the flow direction, the contaminants are not likely to enter the chamber 38 while the ink refill flow rate is not overly retarded. The rows are offset with respect to each other and the induced turbulence has minimal effect on the nozzle refill rate but the air bubbles or other contaminants follow a relatively tortuous flow path which increases the chance of them being retained by the obstructions 40. The embodiment shown uses two rows of obstructions 40 in the form of columns extending between the wafer substrate and the nozzle plate.

Intercolour Surface Barriers in Multi Colour Inkjet Printhead

Figure 51:
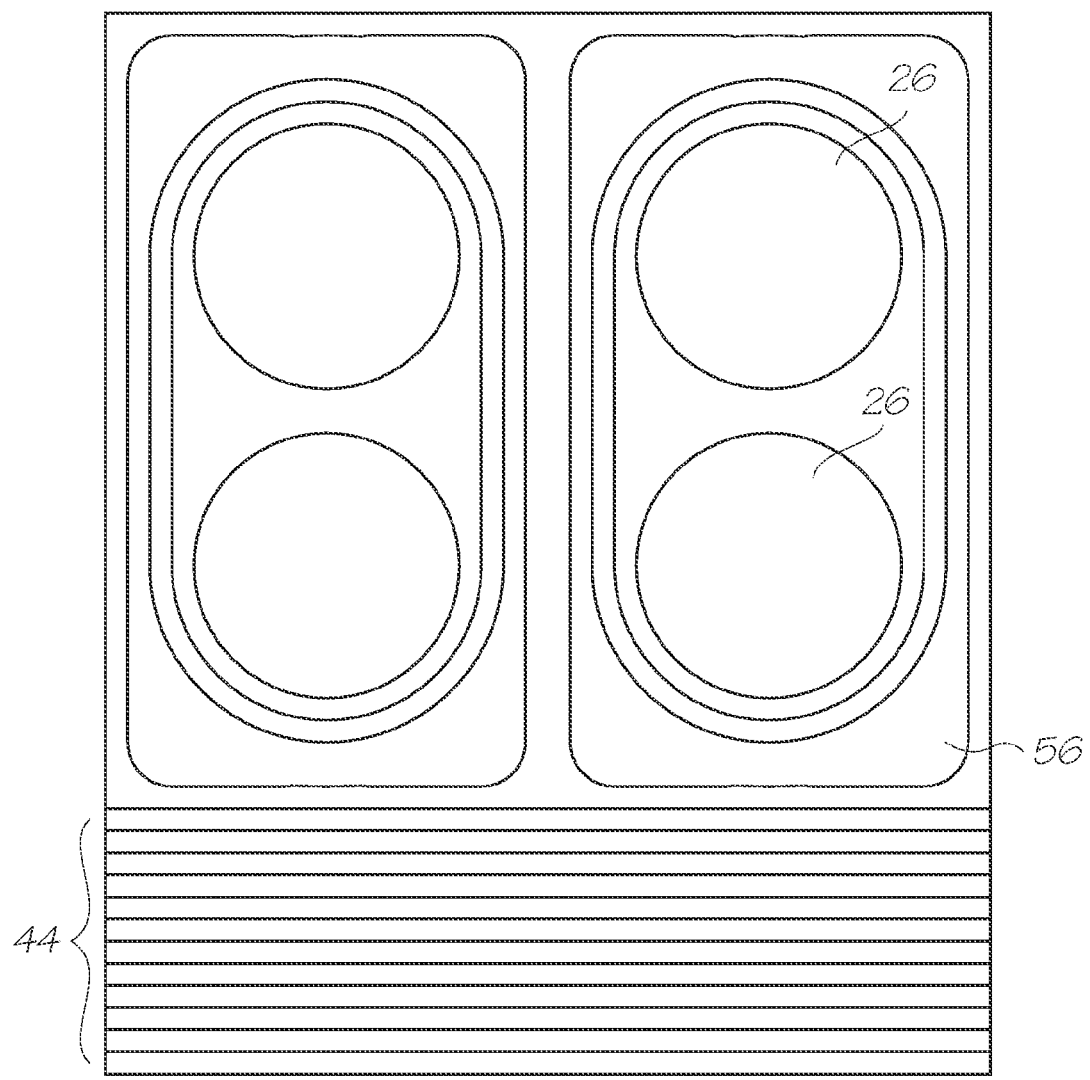
FIG. 51 is a partial plan view of the nozzle plate with residual ink gutters.

Turning now to FIG. 51, the exterior surface of the nozzle 56 is shown for a unit cell such as that shown in FIG. 46 described above. The nozzle apertures 26 are positioned directly above the heater elements (not shown) and a series of square-edged ink gutters 44 are formed in the nozzle plate 56 above the ink conduit 23 (see FIG. 46).

Inkjet printers often have maintenance stations that cap the printhead when it's not in use. To remove excess ink from the nozzle plate, the capper can be disengaged so that it peels off the exterior surface of the nozzle plate. This promotes the formation of a meniscus between the capper surface and the exterior of the nozzle plate. Using contact angle hysteresis, which relates to the angle that the surface tension in the meniscus contacts the surface (for more detail, see the Applicant's co-pending U.S. patent application Ser. No. (11/246, 714) incorporated herein by reference), the majority of ink wetting the exterior of the nozzle plate can be collected and drawn along by the meniscus between the capper and nozzle plate. The ink is conveniently deposited as a large bead at the point where the capper fully disengages from the nozzle plate. Unfortunately, some ink remains on the nozzle plate. If the printhead is a multi-colour printhead, the residual ink left in or around a given nozzle aperture, may be a different colour than that ejected by the nozzle because the meniscus draws ink over the whole surface of the nozzle plate. The contamination of ink in one nozzle by ink from another nozzle can create visible artifacts in the print. Gutter formations 44 running transverse to the direction that the capper is peeled away from the nozzle plate will remove and retain some of the ink in the meniscus. While the gutters do not collect all the ink in the meniscus, they do significantly reduce the level of nozzle contamination of with different coloured ink.

Bubble Trap

Air bubbles entrained in the ink are very bad for printhead operation. Air, or rather gas in general, is highly compressible and can absorb the pressure pulse from the actuator. If a trapped bubble simply compresses in response to the actuator, ink will not eject from the nozzle. Trapped bubbles can be purged from the printhead with a forced flow of ink, but the purged ink needs blotting and the forced flow could well introduce fresh bubbles.

The embodiment shown in FIG. 46 has a bubble trap at the ink inlet 15. The trap is formed by a bubble retention structure 32 and a vent 36 formed in the roof layer. The bubble retention structure is a series of columns 32 spaced around the periphery of the inlet 15. As discussed above, the ink priming features 18 have a dual purpose and conveniently form part of the bubble retaining structure. In use, the ink permeable trap directs gas bubbles to the vent where they vent to atmosphere. By trapping the bubbles at the ink inlets and directing them to a small vent, they are effectively removed from the ink flow without any ink leakage.

Multiple Ink Inlet Flow Paths

Supplying ink to the nozzles via conduits extending from one side of the wafer to the other allows more of the wafer area (on the ink ejection side) to have nozzles instead of complex ink distribution systems. However, deep etched, micron-scale holes through a wafer are prone to clogging from contaminants or air bubbles. This starves the nozzle(s) supplied by the affected inlet.

As best shown in FIG. 48, printheads according to the present invention have at least two ink inlets 15 supplying each chamber 38 via an ink conduit 23 between the nozzle plate and underlying wafer.

Introducing an ink conduit 23 that supplies several of the chambers 38, and is in itself supplied by several ink inlets 15, reduces the chance that nozzles will be starved of ink by inlet clogging. If one inlet 15 is clogged, the ink conduit will draw more ink from the other inlets in the wafer. Although the invention is described above with reference to specific embodiments, it will be understood by those skilled in the art that the invention may be embodied in many other forms.

The invention claimed is:

1. A method of fabricating an inkjet printhead, said method comprising the steps of:
   (a) forming a plurality of MEMS ink ejection assemblies on an ink-ejection surface of a substrate, each ink ejection assembly being sealed with roof material, said roof material spanning across the ink ejection assemblies to define a nozzle plate;
   (b) etching partially into said roof material to form simultaneously a respective nozzle rim for each ink ejection assembly and a plurality of projections patterned across said nozzle plate between nozzle rims; and
   (c) etching through said roof material to form a respective nozzle aperture for each ink ejection assembly, thereby forming said inkjet printhead having said projections patterned across said nozzle plate.

2. The method of claim 1, wherein each nozzle rim comprises at least one rim projection around a perimeter of each nozzle aperture.

3. The method of claim 2, wherein each nozzle rim comprises a plurality of coaxial rim projections around a perimeter of each nozzle aperture.

4. The method of claim 2, wherein said at least one rim projection projects at least 1 micron from said nozzle plate.

5. The method of claim 1, wherein each of said projections patterned across said nozzle plate is a columnar projection.

6. The method of claim 5, wherein each columnar projection projects at least 1 micron from said nozzle plate.

7. The method of claim 5, wherein each columnar projection is spaced apart from an adjacent columnar projection by less than 2 microns.

8. The method of claim 1, wherein each of said projections patterned across said nozzle plate comprises an elongate wall projection.

9. The method of claim 8, wherein each wall projection projects at least 1 micron from said nozzle plate.

10. The method of claim 8, wherein said wall projections are positioned for minimizing color-mixing of inks on said nozzle plate.

11. The method of claim 10, wherein said wall projections extend along said nozzle plate parallel with rows of nozzles, each nozzle in a row ejecting the same colored ink.

12. The method of claim 1, wherein the positions of said nozzle rims and each of said projections patterned across said nozzle plate are defined by photolithographic masking.

13. The method of claim 1, wherein at least half of the surface area of said nozzle plate is patterned with said projections.

14. The method of claim 1, wherein said nozzle plate is spaced apart from said substrate.

15. The method of claim 1, wherein said nozzle plate is comprised of silicon nitride, silicon oxide, silicon oxynitride or aluminium nitride.

16. The method of claim 1, wherein each ink ejection assembly is sealed by CVD or PECVD deposition of said roof material in step (a).

17. The method of claim 16, wherein said roof material is deposited onto a sacrificial scaffold.

18. The method of claim 17, wherein said sacrificial scaffold comprises photoresist.

19. The method of claim 18, further comprising the step of: removing said photoresist in an oxidizing plasma.

* * * * *